(12) United States Patent
Ogihara et al.

(10) Patent No.: US 7,585,613 B2
(45) Date of Patent: Sep. 8, 2009

(54) ANTIREFLECTION FILM COMPOSITION, SUBSTRATE, AND PATTERNING PROCESS

(75) Inventors: Tsutomu Ogihara, Niigata (JP); Motoaki Iwabuchi, Niigata (JP); Takeshi Asano, Niigata (JP); Takafumi Ueda, Niigata (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 282 days.

(21) Appl. No.: 11/653,839

(22) Filed: Jan. 17, 2007

(65) Prior Publication Data

US 2007/0172759 A1    Jul. 26, 2007

(30) Foreign Application Priority Data

Jan. 25, 2006  (JP) .............................. 2006-016397

(51) Int. Cl.
*G03F 7/11* (2006.01)
(52) U.S. Cl. .................... 430/272.1; 430/313; 430/316; 430/317; 430/318; 522/134
(58) Field of Classification Search ........................ None
See application file for complete search history.

(56) References Cited

U.S. PATENT DOCUMENTS 6,337,163 B1 * 1/2002 Sato ............................ 430/30
6,420,088 B1 * 7/2002 Angelopoulos et al. .. 430/272.1

2004/0018346 A1   1/2004  Jung et al.
2004/0191479 A1   9/2004  Hatakeyama et al.

FOREIGN PATENT DOCUMENTS

| JP | A 5-107769 | 4/1993 |
| JP | A 7-86127 | 3/1995 |
| JP | A 2003-114533 | 4/2003 |
| JP | B2 3408415 | 5/2003 |
| JP | A 2005-048152 | 2/2005 |

OTHER PUBLICATIONS

J. M. Moran et al., "High resolution, steep profile resist patterns," Bell Laboratories Murray Hill, New Jersey, J.V. Sci. Technol., 16, [1], pp. 1620-1624, Jun. 1979.

* cited by examiner

*Primary Examiner*—Cynthia Hamilton
(74) *Attorney, Agent, or Firm*—Oliff & Berridge, PLC

(57) ABSTRACT

There is disclosed an antireflection film composition used for lithography comprising: at least
  a light absorbing silicone resin with mass average molecular weight of 30,000 or less in which components having molecular weight of less than 600 account for 5% or less of the whole resin;
  a first acid generator that is decomposed at a temperature of 200 degrees C. or less; and
  an organic solvent. There can be provided an antireflection film composition that prevents intermixing in the vicinity of the antireflection film/photoresist film interface, that provides a resist pattern over the antireflection film with almost vertical wall profile, and that provides less damage to an underlying layer of the antireflection film.

22 Claims, 2 Drawing Sheets

(a)

(b)

(a)

(b)

(c)

(d)

ANTIREFLECTION FILM COMPOSITION, SUBSTRATE, AND PATTERNING PROCESS

BACKGROUND OF THE INVENTION

1. Field of the Invention

The present invention relates to an antireflection film composition used for microprocessing in manufacturing process of semiconductor devices etc., and more particularly, to an antireflection film composition used for lithography using a high energy radiation such as KrF excimer laser light (248 nm), ArF excimer laser light (193 nm), $F_2$ laser light (157 nm), electron beam or X-ray as an exposure light source.

2. Description of the Related Art

With a tendency of realizing high integration and high-speed of LSI, a finer pattern rule has been demanded in recent years. The lithography technique with optical exposure, which is used for general purpose at present, is reaching an inherent limiting resolution derived from a wavelength of a light source.

There is widely used optical exposure using g line (436 nm) or i line (365 nm) of a mercury-vapor lamp as a light source for lithography when a resist pattern is formed. It has been considered that a method of using an exposure light with a shorter wavelength is effective as a means for obtaining a further finer pattern. For this reason, for example KrF excimer laser with a shorter wavelength of 248 nm is used as an exposure light source instead of i line (365 nm) for mass-production process of a 64 M bit DRAM processing method. However, a light source with far shorter wavelength is needed to manufacture DRAM with integrity of 1 G or more which needs still finer processing techniques (for example, a processing size is 0.13 μm or less). Accordingly, lithography with ArF excimer laser (193 nm) has been particularly examined.

There is a multilayer-resist process to form a pattern on a substrate with such lithography techniques.

For example, to prevent deterioration of a resist pattern due to halation or a standing wave, a method of providing an Anti-Reflecting Coating between a substrate and a photoresist film is known.

Particularly, to form a pattern with a high aspect ratio on a stepped substrate, a method of using a substrate with an organic film (also referred to as an organic buried film) thereon, a silicon-containing film thereon, and a photoresist film thereon is known (for example, see J. Vac. Sci. Technol., 16(6), November/December 1979).

In view of enhancing resolution, a thinner photoresist film is desirable. On the other hand, in view of obtaining good embedding characteristics for substrate steps and high etching resistance when a substrate is etched, a thicker photoresist film is desirable. Then, three stacked layers can have a layer with good embedding characteristics for substrate steps and high dry etching resistance; and a layer with high resolution, separately. Consequently, it becomes possible to form a pattern with a high aspect ratio on a stepped substrate.

As the silicon-containing film, for example, a silicon-containing antireflection film may be used.

In order to form a pattern on such a substrate, first, the pattern circuit area of a photoresist film is exposed and then developed with a developer to form a resist pattern on the photoresist film. Second, a pattern is formed on an antireflection film by using the photoresist film as a mask. In this way, the resist pattern is transferred sequentially, and finally, a pattern is formed on a substrate.

However, when an antireflection film is formed with an antireflection film composition and a photoresist film is formed thereon, the intermixing phenomenon can conventionally occur in the vicinity of the antireflection film/photoresist film interface. Furthermore, when a resist pattern is formed on the photoresist film on the antireflection film, the resist pattern can have footing profile or undercut profile. The footing profile can generate a dimension conversion difference after the antireflection film is etched. And the undercut profile, also referred to as reverse tapered profile or negative profile, can cause a resist pattern to collapse after development. Moreover, when an antireflection film is formed, its underlying layer can be damaged. Such problems occur particularly in silicon-containing antireflection films.

In conventional hydrocarbon antireflection film compositions, an antireflection film is formed by crosslinking crosslinkable components linked to film-forming materials in the compositions with a thermal acid generator (See Japanese Unexamined Patent Application Publication No. 2003-114533). Such hydrocarbon antireflection films have very dense structures, thus effectively preventing amine components etc. in a photoresist layer from migrating.

However, when an antireflection film is formed with a silicon-containing antireflection film composition and a photoresist film is formed thereon, the antireflection film has a structure where acids diffuse very easily due to property of silicon-oxygen-silicon bond which is a skeleton forming the antireflection film. Therefore, acid generated upon exposure of the photoresist film diffuses into the antireflection film before contributing to the reaction deprotecting protecting groups of alkali-soluble groups in the resist, resulting in footing profile or residue at the time of developing the resist.

Such phenomenon is observed in conventional hydrocarbon antireflection films. And in order to solve such a problem, a method for adding photo acid generators to antireflection films is disclosed, for example, in Japanese Patent Publication No. 3408415, Japanese Unexamined Patent Application Publication No. H07-86127, H05-107769, etc. The Publication No. 3408415 and No. H07-86127 disclose techniques regarding hydrocarbon antireflection films and both of the publications do not refer to silicon-containing antireflection films at all. On the other hand, the Publication No. H05-107769 discloses techniques adding photo acid generators to silicon-containing antireflection films. However, overlying resist of the silicon-containing antireflection films is negative resist, and the Publication No. H05-107769 does not refer to any case using positive resist which is mainly used for forming resist patterns.

SUMMARY OF THE INVENTION

The present invention has been accomplished to solve the above-mentioned problems, and an object of the present invention is to provide an antireflection film composition that effectively prevents intermixing in the vicinity of the antireflection film/photoresist film interface, that makes a resist pattern over the antireflection film almost vertical wall profile, and that reduces damage to underlying layer of an antireflection film.

In order to achieve the above object, the present invention provides an antireflection film composition used for lithography comprising: at least a light absorbing silicone resin with mass average molecular weight of 30,000 or less in which components having molecular weight of less than 600 account for 5% or less of the whole resin;

a first acid generator that is decomposed at a temperature of 200 degrees C. or less; and an organic solvent.

When such an antireflection film composition according to the present invention is used to form an antireflection film, and a photoresist film is formed over the antireflection film, the intermixing phenomenon hardly occurs in the vicinity of the antireflection film/photoresist film interface. Furthermore, the antireflection film composition contains the silicone resin, thus preventing collapse of pattern profile of resist overlaying the antireflection film. The collapse is the drawback of conventional silicon-containing antireflection films. Forming a resist pattern on a photoresist film over the antireflection film according to the present invention provides a resist pattern with almost vertical wall profile. Furthermore, the antireflection film composition according to the present invention hardens at relatively lower temperature because a first acid generator that is decomposed at a temperature of 200 degrees C. or less is used. In this way, forming an antireflection film by hardening at lower temperature reduces more damage to an underlying layer of the antireflection film.

The antireflection film composition according to the present invention preferably further comprises a second acid generator that has higher decomposition temperature than the first acid generator.

In this case, decomposition temperature of the second acid generator is preferably higher than baking temperature of the antireflection film composition.

And in the above cases, decomposition temperature of the second acid generator is preferably higher than 200 degrees C.

In the antireflection film composition according to the present invention, the second acid generator preferably generates acid upon exposure to radiation.

Forming antireflection films with such antireflection film compositions prevents more certainly collapse of pattern profile like footing of resist overlaying the antireflection film. The collapse is the drawback of conventional silicon-containing antireflection films.

Unlike conventional hydrocarbon antireflection films that have high blocking capabilities of acid diffusion, in silicon-containing antireflection films, siloxane skeleton, which is the main skeleton, can diffuse acid generated upon exposure in overlying resist. At this time, footing etc. is observed when acid balance is disrupted and acid concentration becomes lower in the vicinity of the overlying resist/antireflection film interface than cases using hydrocarbon antireflection films. Such collapse of pattern profile, namely footing profile, is undesirable because a dimension conversion difference is generated after the antireflection film is etched. Therefore, it is preferable to enhance control over acid diffusion in order to form a resist pattern with vertical wall profile on photoresist films more certainly. Then, adding the second acid generator that has higher decomposition temperature than the first acid generator replenishes acid with the vicinity of the interface that is lacking in acid, for example after baking. The second acid generator remains in the antireflection film, and at the time of patterning, acid is generated by exposing the second acid generator to radiation, thus forming a pattern with vertical wall profile more certainly.

In the antireflection film composition according to the present invention, the light absorbing silicone resin preferably comprises:
an organic group having one or more of a carbon-oxygen single bond and/or one or more of a carbon-oxygen double bond;
a light absorbing group; and
a silicon atom whose end is one or more of Si—OH and/or one or more of Si—OR(R represents an alkyl group).

Antireflection films formed with such an antireflection film composition with proper film thicknesses exhibit excellent antireflection effect, hardly vary in film thicknesses after preservation for a long time, and exhibit excellent preservation stability.

In the antireflection film composition according to the present invention, the organic group of the light absorbing silicone resin may comprise one or more group selected from the group consisting of an epoxy group, an ester group, an alkoxy group, and a hydroxy group.

In such an antireflection film composition, crosslinks are formed between a silanol group and an epoxy group, an ester group, an alkoxy group, or a hydroxy group of the organic group without adding crosslinker at the time of forming an antireflection film.

In the antireflection film composition according to the present invention, the light absorbing group of the light absorbing silicone resin may comprise one or more ring selected from the group consisting of an anthracene ring, a naphthalene ring, and a benzene ring.

In the antireflection film composition according to the present invention, the light absorbing group of the light absorbing silicone resin may comprise a silicon-silicon bond.

Selecting such light absorbing groups properly provides an antireflection film with excellent antireflection effect.

Furthermore, the antireflection film composition according to the present invention may further comprise a neutralizer.

The antireflection film composition further comprising a neutralizer effectively prevents generated acid from diffusing to a photoresist film overlaying an antireflection film. As a result, a resist pattern with vertical wall profile is formed more certainly.

The present invention also provides a substrate comprising at least an antireflection film formed with the antireflection film composition according to the present invention, and a positive photoresist film over the antireflection film.

In such a substrate according to the present invention, the intermixing phenomenon is hardly observed in the vicinity of the antireflection film/photoresist film interface. Forming a resist pattern on the positive photoresist film provides a resist pattern with almost vertical wall profile. Forming the antireflection film by hardening the film at lower temperature reduces damage to an underlying layer of the antireflection film.

Furthermore, the present invention provides a patterning process for a substrate by lithography comprising: at least
applying to a substrate the antireflection film composition according to the present invention;
baking the antireflection film composition to form an antireflection film;
applying a photoresist film composition to the antireflection film;
pre-baking the photoresist film composition to form a photoresist film;
exposing a pattern circuit area of the photoresist film;
subsequently developing the photoresist film with a developer to form a resist pattern on the photoresist film; and
etching the antireflection film and the substrate with using as a mask the photoresist film on which the resist pattern is formed to pattern the substrate.

In this way, patterning a substrate by lithography with the antireflection film composition according to the present invention provides fine patterns on the substrate with high precision.

The present invention also provides a patterning process for a substrate by lithography comprising: at least applying to a substrate the antireflection film composition according to the present invention;

baking the antireflection film composition to form an antireflection film;

applying a photoresist film composition to the antireflection film;

pre-baking the photoresist film composition to form a photoresist film;

exposing a pattern circuit area of the photoresist film;

subsequently developing the photoresist film with a developer to form a resist pattern on the photoresist film;

etching the antireflection film with using as a mask the photoresist film on which the resist pattern is formed; and etching the substrate with using the patterned antireflection film as a mask to pattern the substrate.

In this way, a substrate can be patterned by using an antireflection film formed with the antireflection film composition according to the present invention as a mask, whereby fine patterns are formed on the substrate with high precision.

The present invention also provides a patterning process for a substrate by lithography comprising: at least forming an organic film over a substrate;

applying to the organic film the antireflection film composition according to the present invention;

baking the antireflection film composition to form an antireflection film;

applying a photoresist film composition to the antireflection film;

pre-baking the photoresist film composition to form a photoresist film;

exposing a pattern circuit area of the photoresist film;

subsequently developing the photoresist film with a developer to form a resist pattern on the photoresist film;

etching the antireflection film with using as a mask the photoresist film on which the resist pattern is formed;

etching the organic film with using the patterned antireflection film as a mask; and etching the substrate to pattern the substrate.

In this way, an antireflection film may be formed through the organic film over the substrate with the antireflection film composition according to the present invention. Patterning the substrate by lithography with such an antireflection film provides fine patterns on the substrate with high precision.

As described above, the antireflection film composition according to the present invention comprises at least a light absorbing silicone resin with mass average molecular weight of 30,000 or less in which components having molecular weight of less than 600 account for 5% or less of the whole resin;

a first acid generator that is decomposed at a temperature of 200 degrees C. or less; and an organic solvent.

When such an antireflection film composition according to the present invention is used to form an antireflection film, and a photoresist film is formed over the antireflection film, the intermixing phenomenon hardly occurs in the vicinity of the antireflection film/photoresist film interface.

Furthermore, forming a resist pattern on the photoresist film over the antireflection film provides a resist pattern with almost vertical wall profile.

The antireflection film composition according to the present invention hardens at relatively lower temperature because a first acid generator that is decomposed at a temperature of 200 degrees C. or less is used. In this way, forming an antireflection film by hardening the film at lower temperature reduces more damage to an underlying layer of the antireflection film.

DESCRIPTION OF THE INVENTION AND A PREFERRED EMBODIMENT

Figure 1:
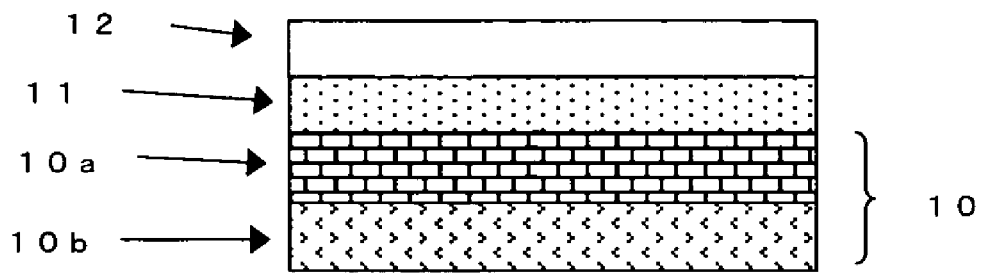
FIG. 1 is a schematic section view of one embodiment of a substrate according to the present invention.

A more thorough disclosure of the present invention is presented in the detailed description which follows.

As mentioned above, use of conventional antireflection film compositions causes problems that the intermixing phenomenon occurs in the vicinity of the antireflection film/photoresist film interface, a resist pattern has not vertical wall profile but undercut profile, and forming an antireflection film can damage its underlying layer.

Then the present inventors have investigated thoroughly to develop an antireflection film composition that hardly causes the intermixing phenomenon in the vicinity of the antireflection film/photoresist film interface, that provides a resist pattern over the antireflection film with almost vertical wall profile, and that provides less damage to an underlying layer of an antireflection film when the antireflection film is formed.

As a result, the present inventors have found an antireflection film composition comprising: at least a light absorbing silicone resin with mass average molecular weight of 30,000 or less in which components having molecular weight of less than 600 account for 5% or less of the whole resin;

a first acid generator that is decomposed at a temperature of 200 degrees C. or less; and an organic solvent.

Such a composition effectively prevents the intermixing phenomenon in the vicinity of the antireflection film/photoresist film interface, provides a resist pattern over the antireflection film with almost vertical wall profile, and provides less damage to an underlying layer of an antireflection film when the antireflection film is formed. Thus, they have accomplished the present invention.

That is, the present invention provides an antireflection film composition used for lithography comprising: at least a light absorbing silicone resin with mass average molecular weight of 30,000 or less in which components having molecular weight of less than 600 account for 5% or less of the whole resin;

a first acid generator that is decomposed at a temperature of 200 degrees C. or less; and an organic solvent.

When such an antireflection film composition according to the present invention is used to form an antireflection film, and a photoresist film is formed over the antireflection film, the intermixing phenomenon hardly occurs in the vicinity of the antireflection film/photoresist film interface.

Furthermore, the antireflection film composition contains the silicone resin, thus preventing collapse of pattern profile of resist overlaying the antireflection film. The collapse is the drawback of conventional silicon-containing antireflection films. Forming a resist pattern on a photoresist film over the antireflection film according to the present invention provides a resist pattern with almost vertical wall profile.

That is, unlike hydrocarbon antireflection films that have high blocking capabilities of acid diffusion, in conventional silicon-containing antireflection films, siloxane skeleton, which is the main skeleton, has a structure easily diffusing acid from overlying resists. As a result, acid balance is disrupted and acid concentration becomes lower in the vicinity of the overlying resist/antireflection film interface than cases using hydrocarbon antireflection films, whereby collapse of pattern profile such as footing tends to occur. However, an antireflection film composition according to the present invention comprises a light absorbing silicone resin with mass average molecular weight of 30,000 or less in which components having molecular weight of less than 600 account for 5% or less of the whole resin. Consequently, use of such an antireflection film composition provides an antireflection film with a dense structure that is similar to conventional hydrocarbon antireflection films, whereby acid diffusion can be prevented as with hydrocarbon antireflection films, and thus preventing collapse of pattern profile.

Furthermore, the antireflection film composition according to the present invention contains a first acid generator that is decomposed at a temperature of 200 degrees C. or less, whereby an antireflection film can be formed by hardening the film at lower temperature. As a result, damage to an underlying layer of the antireflection film can be further reduced.

In recent years, along with use of finer cell in order to improve performance of semiconductor devices such as response speed, low dielectric constant insulating materials having lower k value than conventional insulator films, so-called Low-k materials, have come to be used around metal wiring. In general, low dielectric constant films derived from such low dielectric constant insulating materials do not have high heat resistance. When an underlying layer of an antireflection film is an organic film, high temperature for forming the antireflection film thermally damages the underlying organic film, and gaseous low molecular weight compound evolved from the organic film can damage the antireflection film. The antireflection film composition according to the present invention hardens at lower temperature to form an antireflection film over low dielectric constant insulator films, organic films, etc., thereby giving less damage to the low dielectric constant insulator films, the organic films, etc.

In the antireflection film composition according to the present invention, the light absorbing silicone resin preferably comprises:

an organic group having one or more of a carbon-oxygen single bond and/or one or more of a carbon-oxygen double bond;

a light absorbing group; and a silicon atom whose end is one or more of Si—OH and/or one or more of Si—OR(R represents an alkyl group).

Antireflection films formed with such an antireflection film composition with proper film thicknesses exhibit excellent antireflection effect, hardly vary in film thicknesses after preservation for a long time, and exhibit excellent preservation stability.

Such a light absorbing silicone resin can be obtained, for example, by carrying out hydrolysis and condensation of one kind or a mixture of two or more kinds of silicon-containing compounds represented by the following general formula (1).

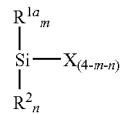

(In the formula, $R^{1a}$ is an organic group having one or more of a carbon-oxygen single bond and/or one or more of a carbon-oxygen double bond; $R^2$ is a monovalent organic group having a light absorbing group; X independently represents a halogen atom, a hydrogen atom, a hydroxy group, an alkoxy group having 1-6 carbon atoms, or an alkylcarbonyloxy group having 1-6 carbon atoms. Each of m and n represents an integer of 0 to 3 and satisfies the relationship of $0<(4-m-n)\leq 4$.)

In an antireflection film composition according to the present invention, molecular weight (relative to polystyrene standard) of a light absorbing silicone resin obtained from a silicon-containing compound represented by the general formula (1) measured by gel permeation chromatography (GPC) is 30,000 or less, preferably 25,000 or less, more preferably 1,000 to 20,000. Furthermore, in the light absorbing silicone resin, components having molecular weight of less than 600 account for 5% or less of the whole resin.

The organic group having one or more of a carbon-oxygen single bond and/or one or more of a carbon-oxygen double bond in the general formula (1) has preferably 2 to 30 carbon atoms, more preferably the organic group is one or more organic group(s) selected from a group consisting of an epoxy group, an ester group, an alkoxy group, and a hydroxy group. The organic group means a group containing carbon, and may further contain hydrogen, nitrogen, sulfur, and so on. An example of the organic group having one or more of a carbon-oxygen single bond and/or one or more of a carbon-oxygen double bond in the general formula (1) is as follows.

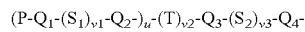

(In the formula, P represents a hydrogen atom, a hydroxy group, an epoxy ring (OCH$_2$CH—), a C$_{1-4}$ alkoxy group, a C$_{1-6}$ alkylcarbonyloxy group, or a C$_{1-6}$ alkylcarbonyl group. $Q_1$, $Q_2$, $Q_3$, and $Q_4$ independently represent —$C_qH_{(2q-p)}P_p$— (In the formula, P represents the same as above; p represents an integer of 0 to 3; q represents an integer of 0 to 10.) u represents an integer of 0 to 3. $S_1$ and $S_2$ independently represent —O—, —CO—, —OCO—, —COO—, or —OCOO—. v1, v2, and v3 independently represent 0 or 1. Examples of T are shown below. Bonding sites of T to $Q_2$ and $Q_3$ are not particularly limited. The bonding sites may be properly selected in consideration of reactivity depending on stereostructure, availability of commercial reagents to be used for the reaction, and so on.)

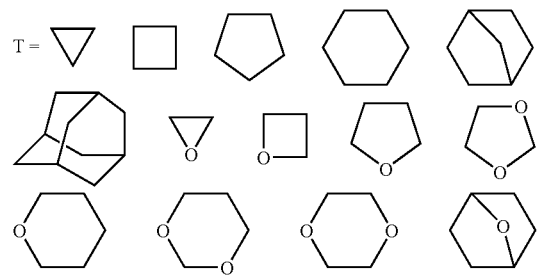

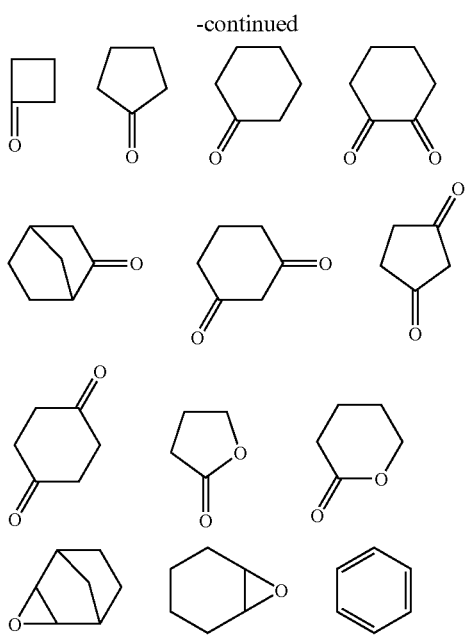
Suitable examples of the organic group having one or more of a carbon-oxygen single bond and/or one or more of a carbon-oxygen double bond in the general formula (1) are shown below. Incidentally, (Si) shows a bonding site with a Si atom in the following formulae.
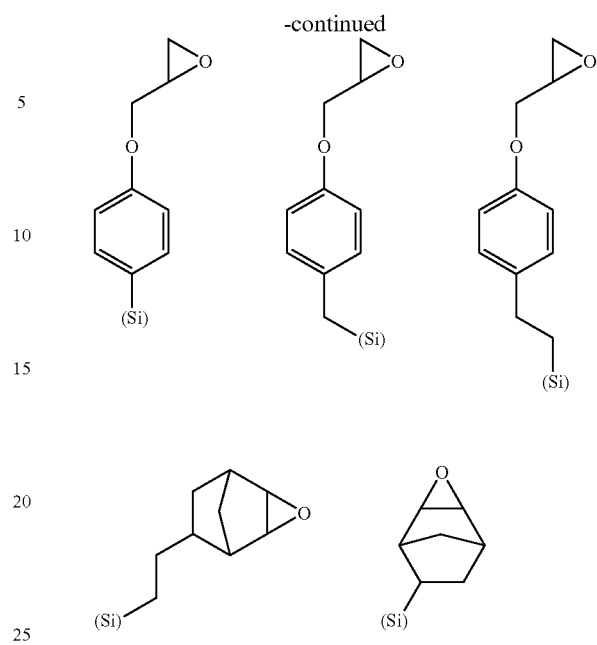
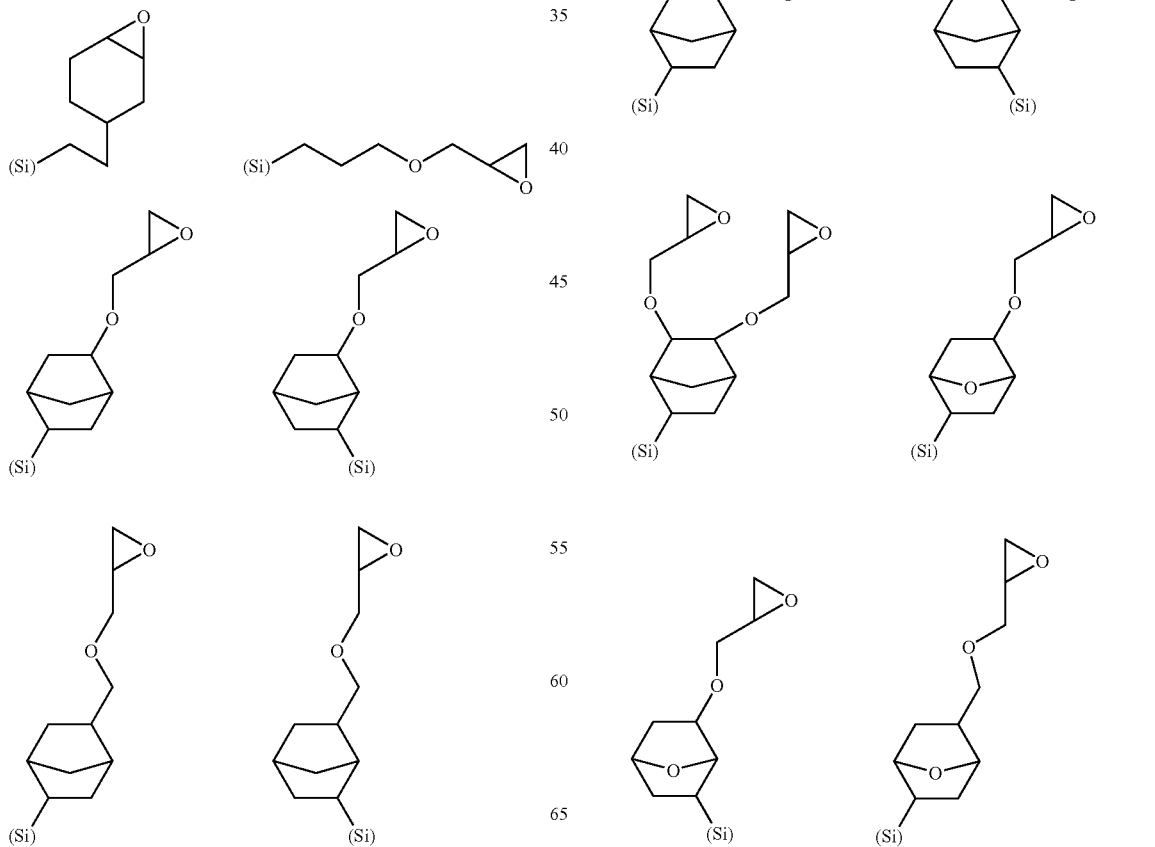

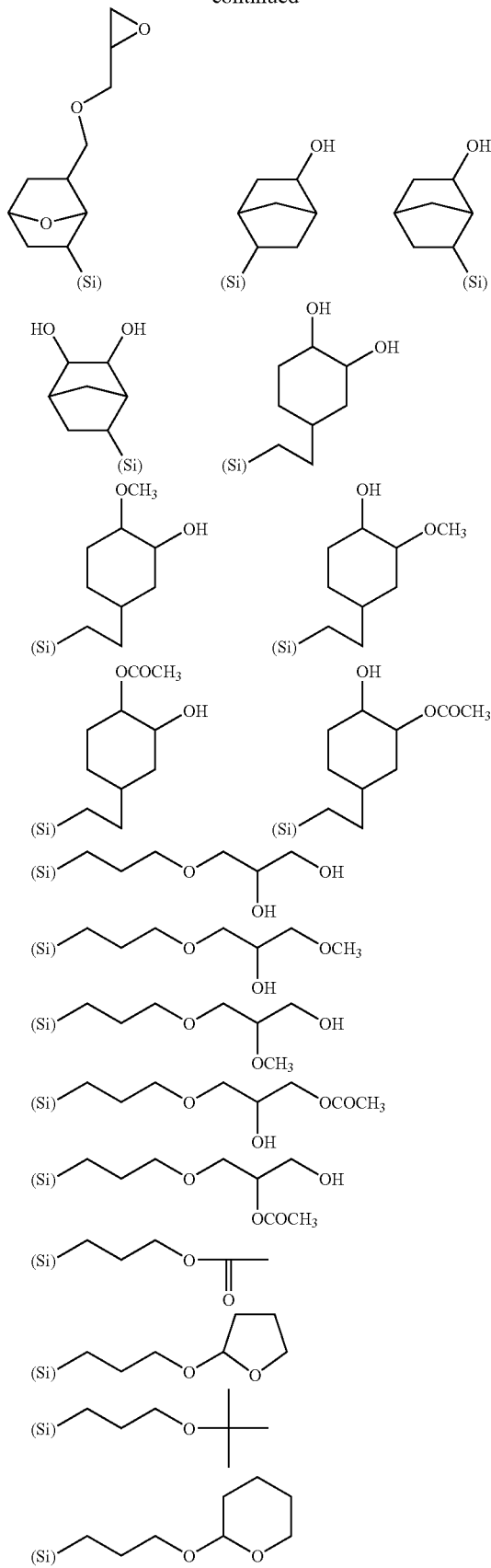

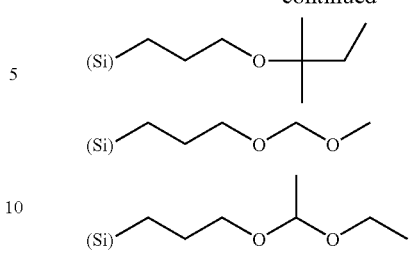

Examples of the light absorbing group in the general formula (1) absorbs light at a wavelength of 150 to 300 nm. This group has preferably any one or more of an anthracene ring, a naphthalene ring, and a benzene ring. Furthermore, these rings may have one or more of substituent(s). Suitable examples of the substituent may include $C_{1-6}$ alkyl group, $C_{1-6}$ alkoxy group, $C_{1-6}$ acyloxy group, and $C_{1-6}$ acetal group. More suitable examples of the substituent may include methyl group, methoxy group, t-butoxy group, t-amyloxy group, acetoxy group, 1-ethoxy ethoxy group, and the like. Examples of the light absorbing group are shown below.

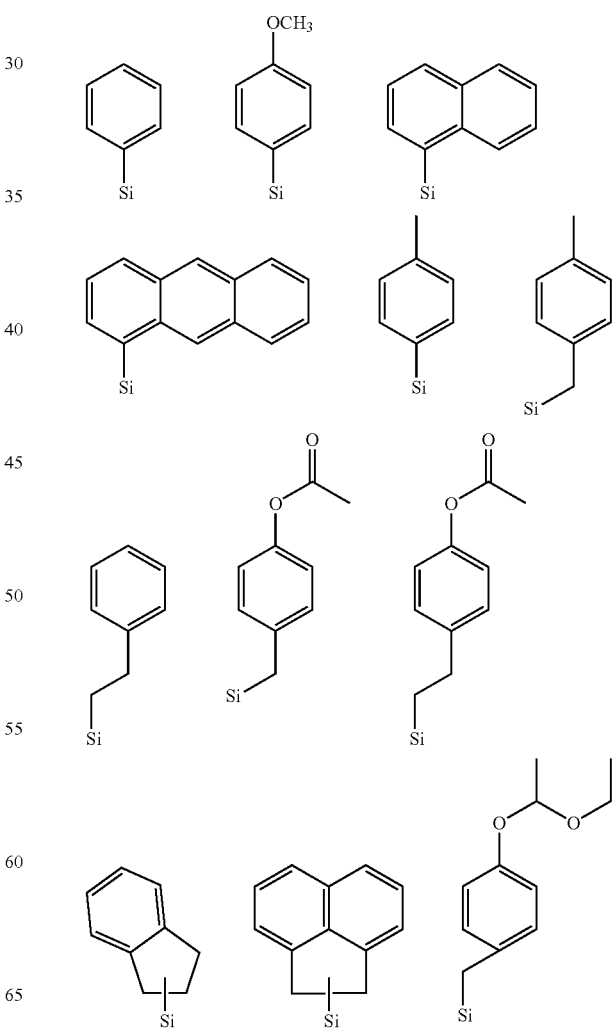

-continued

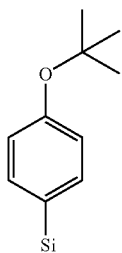

A methoxy group, an acetoxy group and an acetal group in the light absorbing group can also be deprotected to be a hydroxy group during or after polymerization.

In particular, the light absorbing group having a benzene ring or benzene rings is preferably used for lithography using light at a wavelength of 200 nm or less.

Besides the aromatic light absorbing groups, a light absorbing group which has a Si—Si bond or Si—Si bonds can also be used. Specific examples thereof are shown below.

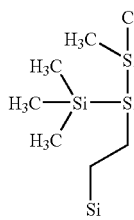
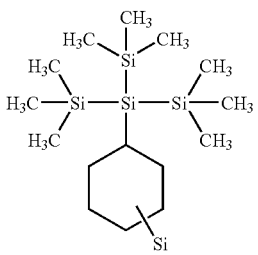

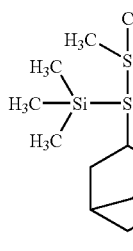
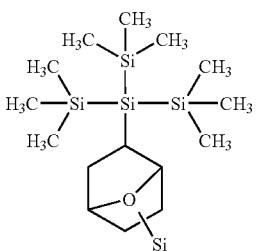

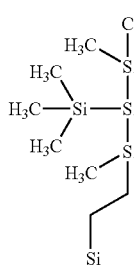

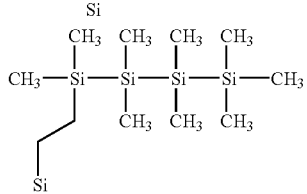

-continued

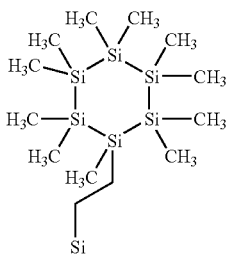
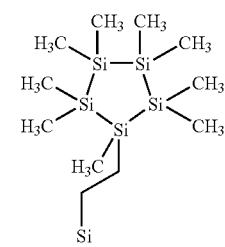

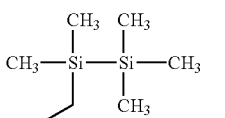
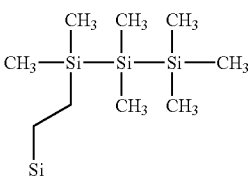

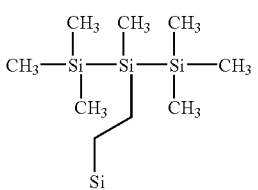

The light absorbing silicone resin in the antireflection film composition can be synthesized, for example, by carrying out hydrolytic co-condensation of the silicon-containing compounds (monomers) represented by the general formula (1).

Water is preferably added in an amount of 0.2-10 mole per one mole of the monomers in the hydrolytic reaction. A catalyst can also be used at this time. Examples of the catalyst may include acids such as acetic acid, propionic acid, oleic acid, stearic acid, linolic acid, salicylic acid, benzoic acid, formic acid, malonic acid, phthalic acid, fumaric acid, citric acid, tartaric acid, hydrochloric acid, sulfuric acid, nitric acid, sulfonic acid, methyl sulfonic acid, toluenesulfonic acid, trifluoromethane sulfonic acid; bases such as ammonia, sodium hydroxide, potassium hydroxide, barium hydroxide, calcium hydroxide, trimethylamine, triethylamine, triethanolamine, tetra methyl ammonium hydroxide, choline hydroxide, tetra butyl ammonium hydroxide; metal chelate compounds such as tetraalkoxy titanium, trialkoxy mono(acetyl acetonate) titanium, tetra alkoxy zirconium, trialkoxy mono(acetyl acetonate) zirconium.

The reaction may be conducted by dissolving water and a catalyst in an organic solvent, and then adding monomers thereto. At this moment, the monomers may be diluted with the organic solvent in advance. A reaction temperature is 0 to 100 degrees C., preferably 10 to 80 degrees C. The following method is preferably used: heating up to 10 to 50 degrees C. at the time of dropping monomers, and then heating to an elevated temperature of 40 to 80 degrees C. for aging.

Alternatively, the reaction may be conducted by dissolving a catalyst without moisture in an organic solvent, and then adding water or water diluted with an organic solvent thereto. A reaction temperature is 0 to 100 degrees C., preferably 10 to 80 degrees C. The following method is preferably used: heating up to 10 to 50 degrees C. at the time of dropping monomers, and then heating to an elevated temperature of 40 to 80 degrees C. for aging.

As for the organic solvent, those soluble in water are preferably used. Examples thereof may include: methanol, ethanol, 1-propanol, 2-propanol, 1-buthanol, 2-buthanol, 2-methyl-1-propanol, acetone, tetrahydrofuran, acetonitrile, propylene glycol monomethyl ether, ethylene glycol monomethyl ether, propylene glycol monomethyl ether, ethylene glycol monoethyl ether, propylene glycol dimethyl ether, diethylene glycol dimethyl ether, propylene glycol monomethyl ether acetate, propylene glycol monoethyl ether acetate, propylene glycol monopropyl ether, and a mixture thereof.

After that, an organic solvent which is hardly soluble or insoluble in water is added to the reaction mixture. Then, an organic-solvent layer is separated, and is washed with water to remove a catalyst used in the hydrolytic condensation. At this moment, the catalyst may be neutralized when necessary.

Examples of the organic solvent which is hardly soluble or insoluble in water may include: tetrahydrofuran, toluene, hexane, ethyl acetate, cyclohexanone, methyl-2-n-amyl ketone, propyleneglycol monomethyl ether, ethylene glycol monomethyl ether, propylene glycol monoethyl ether, ethylene glycol monoethyl ether, propyleneglycol dimethyl ether, diethylene glycol dimethyl ether, propyleneglycol monomethyl ether acetate, propyleneglycol monoethyl ether acetate, ethyl pyruvate, butyl acetate, methyl 3-methoxy propionate, ethyl 3-ethoxy propionate, tert-butyl acetate, tert-butyl propionate, propyleneglycol mono tert-butyl-ether acetate, γ-butyl lactone, and a mixture thereof.

Then, an organic-solvent layer is separated and is dehydrated. Because remained moisture advances a condensation reaction of remained silanol, it is necessary to dehydrate the layer sufficiently. For example, an adsorption method with salts such as magnesium sulfate or molecular sieves, or an azeotropic dehydration method with removing the solvent is preferably used.

Alternatively, an organic solvent which is hardly soluble or insoluble in water may be used for hydrolytic condensation of the monomers. Examples thereof may include: tetrahydrofuran, toluene, hexane, ethyl acetate, cyclohexanone, methyl-2-n-amyl ketone, propyleneglycol monomethyl ether, ethylene glycol monomethyl ether, propylene glycol monoethyl ether, ethylene glycol monoethyl ether, propyleneglycol dimethyl ether, diethylene glycol dimethyl ether, propyleneglycol monomethyl ether acetate, propyleneglycol monoethyl ether acetate, ethyl pyruvate, butyl acetate, methyl 3-methoxy propionate, ethyl 3-ethoxy propionate, tert-butyl acetate, tert-butyl propionate, propyleneglycol mono tert-butyl-ether acetate, γ-butyl lactone, and a mixture thereof.

Then, the monomers are dissolved in the organic solvent, and water is added thereto to initiate hydrolytic reaction.

The catalyst may be added to water or to the organic solvent in advance. A reaction temperature is 0 to 100 degrees C., preferably 10 to 80 degrees C. The following method is preferably used: heating up to 10 to 50 degrees C. at the time of dropping water, and then heating to an elevated temperature of 40 to 80 degrees C. for aging.

By adjusting the reaction conditions in the hydrolytic reaction, a light absorbing silicone resin in which a ratio of a silicon atom whose end is one or more of Si—OH and/or one or more of Si—OR (R represents an alkyl group) is 0.1 to 50 mole %. The end group can be identified easily with $^{29}$Si—NMR. When a ratio of a silicon atom whose end is one or more of Si—OH and/or one or more of Si—OR is defined as A mole %, A can be expressed by the following equation.

$$A\ (\%) = \frac{\sum_{n=1}^{3}(4-n)Qn + \sum_{n=1}^{2}(3-n)Tn + D1}{4 \times \sum_{n=1}^{4} Qn + 3 \times \sum_{n=1}^{3} Tn + 2 \times \sum_{n=1}^{2} Dn} \times 100$$

In the formula, $Q_1$, $Q_2$, $Q_3$, and $Q_4$ represent the number of siloxane bonding of a four functional Si atom; $T_1$, $T_2$, and $T_3$ represent the number of siloxane bonding of a trifunctional Si atom; and $D_1$ and $D_2$ represent the number of siloxane bonding of a bifunctional Si atom. Respective bonding amounts are calculated by using integrated peak values measured with $^{29}$Si—NMR.

At this moment, when A is 0.1 mole % or less, the number of end Si—OH and end Si—OR used for crosslinking resin may be so small that an applied film may not set hard enough. Consequently, the applied film can intermix with resist to be used in the subsequent step, and a resist pattern with a vertical wall profile may not be obtained. On the other hand, when A is 50 mole % or more, condensation may not occur enough and an applied film with insufficient strength can be obtained. This can provide undesired results like collapse of a resist pattern.

Furthermore, when A lies in the range of 0.1 mole % to 50 mole %, and the ratio of Si—OH to Si—OR lies in the following range, an applied film that set hard more sufficiently can be obtained. Specifically, it is more preferable that Si—OH/Si—OR is from (100/0) to (20/80). At this time, the ratio of —SiOH/—SiOR can be obtained with $^{13}$C-NMR by using an integral intensity (B) per a carbon atom at alpha position of an Si atom as an internal standard. That is, when R of —SiOR is $R_x$—CH$_2$, —SiOR is —SiOC̲H$_2$—$R_x$. And a Si—OR amount (B) is obtained from the ratio of integral intensity of the underlined carbon atom.

Use of $^{29}$Si—NMR provides a total amount (C) of Si—OH and Si—OR. Accordingly, the ratio of Si—OH to Si—OR satisfies the relationship: Si—OH/Si—OR=(C—B)/B.

When the ratio of Si—OR is less than Si—OH/Si—OR=20/80, condensation between Si—OHs and between Si—OH and Si—OR occur easily. Consequently, an applied film with sufficient strength that hardly intermix with other layers can be obtained.

Furthermore, when the organic group with carbon-oxygen bonds has an epoxy group, silicone resin is synthesized, and then modification reaction can convert the silicone resin to modified silicone resin having an organic group with mutually different carbon-oxygen bonds. Examples of an repeating unit of the modified silicone resin are shown below.

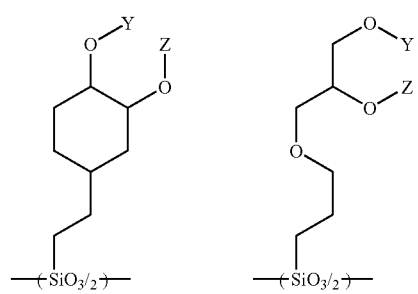

-continued

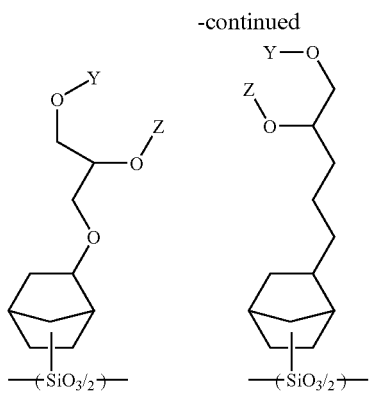
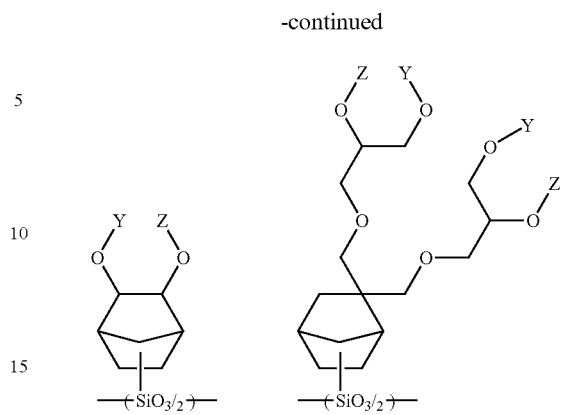

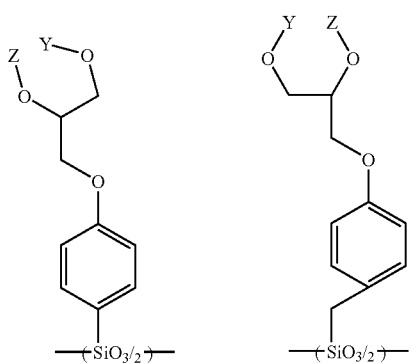
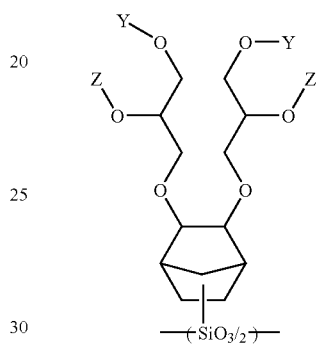

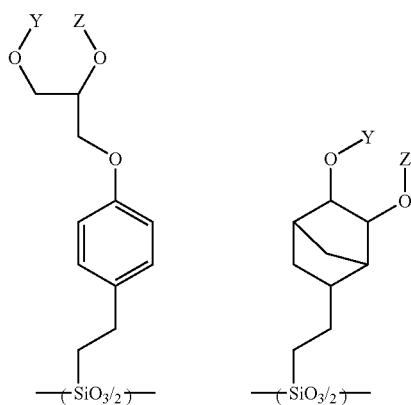

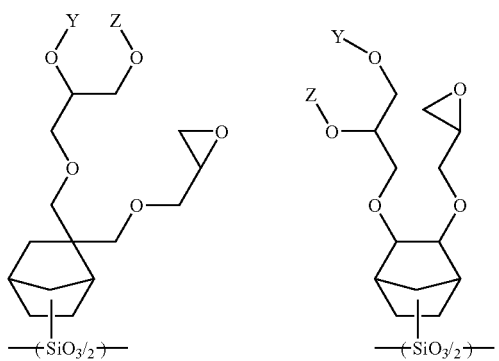

In the formulae, Y and Z independently represent a hydrogen atom, a $C_{1-7}$ alkyl group, a $C_{1-8}$ alkylcarbonyl group, or a $C_{1-6}$ alkoxycarbonyl group. Specifically, examples thereof may include: methyl group, ethyl group, n-propyl group, i-propyl group, n-butyl group, i-butyl group, sec-butyl group, t-butyl group, n-pentyl group, 2-ethylbutyl group, 3-ethylbutyl group, 2,2-diethylpropyl group, cyclopentyl group, n-hexyl group, cyclohexyl group, formyl group, acetyl group, propionyl group, butyryl group, isobutyryl group, valeryl group, iso valeryl group, pivaloyl group, cyclohexylcarbonyl group, methoxycarbonyl group, ethoxycarbonyl group, propoxycarbonyl group, butoxycarbonyl group, t-butoxycarbonyl group, and so on.

The conversion from an original silicone resin can be carried out with a commonly known techniques. For example, heating the original silicone resin together with alcohols or carboxylic acids in the presence of an acid catalyst, an alkaline catalyst, or quaternary ammonium catalyst converts the original silicone resin to a modified silicone resin easily. Incidentally, when a carboxylic acid is used in the reaction, the carboxylic acid itself works as a catalyst. Therefore, it is not necessary to add other catalyst.

Examples of the acid catalyst used for the reaction may include: hydrochloric acid, nitric acid, sulfuric acid, phosphoric acid, perchloric acid, methansulfonic acid, benzenesulfonic acid, toluenesulfonic acid, trifluoro acetic acid, trifluoromethane sulfonic acid, oxalic acid, acetic acid, propionic acid, oleic acid, stearic acid, linoleic acid, salicylic acid, benzoic acid, formic acid, malonic acid, phthalic acid, fumaric acid, citric acid, tartaric acid, and so on.

Examples of the alkaline catalyst may include: bases such as ammonia, sodium hydroxide, potassium hydroxide, barium hydroxide, calcium hydroxide, triethylamine, triethanolamine, benzyl diethylamine, tetraethylammonium hydroxide, choline hydroxide, tetrabutylammonium hydroxide; quaternary ammonium catalysts such as benzyl triethylammonium chloride, benzyl triethylammonium bromide.

Blend of thus-obtained original silicone resin and modified silicone resin can also be used (hereinafter, "silicone resin" includes the original silicone resin, the modified silicone resin and blend of both). A blend ratio thereof has a significant effect on properties of an antireflection film composition to be obtained. Accordingly, the silicone resin can be blended with an arbitrary ratio so that the best properties are obtained. It is more preferable to subject obtained blend to heating, stirring, ultrasonic irradiation, kneading, and so on to make the polymer composition uniform.

An organic solvent used for an antireflection film composition according to the present invention can be any organic solvent in which a light absorbing silicone resin, an acid generator, other additives and the like can be dissolved. Examples of such an organic solvent may include: ketones such as cyclohexanone and ethyl-2-n-amyl ketone; alcohols such as 3-methoxy butanol, 3-ethyl-3-methoxy butanol, 1-methoxy-2-propanol, 1-ethoxy-2-propanol; ethers such as propylene glycol monoethyl ether, ethylene glycol monoethyl ether, propylene glycol monoethyl ether, ethylene glycol monoethyl ether, propylene glycol diethyl ether, diethylene glycol diethyl ether; esters such as propylene glycol monomethyl ether acetate, propylene glycol monoethyl ether acetate, ethyl lactate, ethyl pyruvate, butyl acetate, ethyl 3-methoxy propionate, ethyl 3-ethoxy propionate, tert-butyl acetate, tert-butyl propionate, propylene-glycol mono tert-butyl-ether acetate; lactones such as γ-butyrolactone. Above solvents may be used alone or in admixture. The organic solvents are not restricted to those mentioned above.

Among the above organic solvents, diethylene glycol diethyl ether, 1-ethoxy-2-propanol, propylene glycol monoethyl ether acetate, or a mixture thereof is preferably used, because the solubility of an acid generator in the resist composition to these solvents is remarkably excellent.

Preferably, the organic solvent is used in an amount of 400 to 500,000 parts by mass, more preferably 500 to 100,000 parts by mass, to 100 parts by mass of the silicone resin.

A first acid generator contained in the antireflection film composition according to the present invention is decomposed at a temperature of 200 degrees C. or less. Examples of such a first acid generator include Lewis acid complex, dicyandiamide, modified imidazole, organic acid, hydrazide, ammonium salt of strong acid, amine salt of strong acid, imide compound, etc. that decompose at a temperature of 200 degrees C. or less. Preferred examples are ammonium salt of strong acid, amine salt of strong acid, and Lewis acid complex that decompose at a temperature of 200 degrees C. or less. More preferred example is quaternary ammonium salt of strong acid that decompose at a temperature of 200 degrees C. or less. Examples of the strong acid include hydrochloric acid, oxalic acid, sulfuric acid, phosphoric acid, trifluoroacetic acid, methanesulfonic acid, benzenesulfonic acid, p-toluenesulfonic acid, trifluoromethanesulfonic acid, perfluorobutanesulfonic acid, etc. As for the quaternary ammonium, examples of substituents that tend to pyrolytically decompose at lower temperature include one or more benzyl group(s) and benzyl group(s) in which one or more hydrogen atom(s) on benzene ring is substituted with alkyl group, aryl group, alkoxy group, halogen atom, etc. Preferred examples of the substituents include benzyl group, 4-methyl benzyl group, 4-methoxy benzyl group, 4-t-butoxy benzyl group, 4-phenyl benzyl group, 4-phenoxy benzyl group. Examples of remaining substituents include saturated or unsaturated linear, branched or cyclic alkyl group or aryl group having 20 or less carbon atoms. Preferred examples are a methyl group, an ethyl group, a propyl group, a butyl group, a pentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, a octadecyl group, a nonadecyl group, an eicosyl group, and branched isomers, cyclic isomers, and unsaturated group thereof. Furthermore, preferred examples also include a phenyl group, a tolyl group, a dimethylphenyl group, a trimethylphenyl group, a biphenyl group, a naphthyl group, a methoxyphenyl group, a t-butoxyphenyl group, a fluorophenyl group, a chlorophenyl group, a bromophenyl group, etc. Particular examples of the quaternary ammonium salt of strong acid include, without limitation, benzyltributylammonium bromide, benzyltributylammonium chloride, benzyltriethylammonium bromide, benzyltriethylammonium chloride.

Incidentally, the first acid generator may be used alone or in admixture.

An amount of the first acid generator to be added is preferably 0.1 to 50 parts by mass, more preferably 0.3 to 40 parts by mass per 100 parts by mass of the light absorbing silicone resin. When 0.1 parts by mass or more of the acid generator is added, sufficient amount of acid is generated and a crosslinking reaction is induced sufficiently. On the other hand, when 50 parts by mass or less of the acid generator is added, there is less possibility that the mixing phenomenon in which acid migrates to the overlying photoresist film occurs.

The antireflection film composition according to the present invention preferably further comprises a second acid generator that has higher decomposition temperature than the first acid generator.

In this case, decomposition temperature of the second acid generator is preferably higher than baking temperature of the antireflection film composition.

And in the above cases, decomposition temperature of the second acid generator is preferably higher than 200 degrees C.

In the antireflection film composition according to the present invention, the second acid generator preferably generates acid upon exposure to radiation.

Forming antireflection films with such antireflection film compositions prevents more certainly collapse of pattern profile like footing of resist overlaying the antireflection film. The collapse is the drawback of conventional silicon-containing antireflection films.

Unlike conventional hydrocarbon antireflection films that have high blocking capabilities of acid diffusion, in silicon-containing antireflection films, siloxane skeleton, which is the main skeleton, can diffuse acid generated upon exposure in overlying resists. At this time, footing etc. is observed when acid balance is disrupted and acid concentration becomes lower in the vicinity of the overlying resist/antireflection film interface than cases using hydrocarbon antireflection films. Such collapse of pattern profile, namely footing profile, is undesirable because a dimension conversion difference is generated after the antireflection film is etched. Therefore, it is preferable to enhance control over acid diffusion in order to form a resist pattern with vertical wall profile on photoresist films more certainly. Then, adding the second acid generator that has higher decomposition temperature than the first acid generator replenishes acid with the vicinity of the interface that is lacking in acid, for example after baking. The second acid generator remains in the antireflection film, and at the time of patterning, acid is generated by exposing the second acid generator to radiation, thus forming a pattern with vertical wall profile more certainly.

Particularly when an antireflection film to be formed is a thin film with a thickness of 60 nm or less, an acid generator that generates acid upon exposure to radiation is preferably added as the second acid generator, whereby a pattern with vertical wall profile can be formed more certainly and effectively.

Examples of the second acid generator are as follows:

i) an onium salt represented by the following general formulae (P1a-1), (P1a-2) or (P1b), ii) a diazomethane derivative represented by the following general formula (P2), iii) a glyoxime derivative represented by the following general formula (P3), iv) a bis sulfone derivative represented by the following general formula (P4), v) a sulfonate of an N-hydroxy imide compound represented by the following general formula (P5), vi) a β-keto sulfonic-acid derivative, vii) a disulfone derivative, viii) a nitro benzyl sulfonate derivative, and ix) a sulfonate derivative, etc.

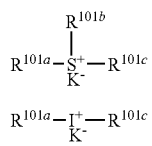

(In the formulae, $R^{101a}$, $R^{101b}$, and $R^{101c}$ independently represent a linear, branched or cyclic alkyl group, alkenyl group, oxoalkyl group or oxoalkenyl group each having 1-12 carbon atoms, an aryl group having 6-20 carbon atoms, or an aralkyl group or an aryl oxoalkyl group having 7-12 carbon atoms. Some or all of hydrogen atoms of these groups may be substituted with an alkoxy group etc. $R^{101b}$ and $R^{101c}$ may constitute a ring. In the case that they constitute a ring, $R^{101b}$ and $R^{101c}$ represent an alkylene group having 1-6 carbon atoms respectively. $K^-$ represents a non-nucleophilic counter ion.)

The above-mentioned $R^{101a}$, $R^{101b}$, and $R^{101c}$ may be the same or different mutually. Examples thereof as an alkyl group may include: a methyl group, an ethyl group, a propyl group, an isopropyl group, n-butyl group, sec-butyl group, tert-butyl group, a pentyl group, a hexyl group, a heptyl group, an octyl group, a cyclopentyl group, a cyclohexyl group, a cycloheptyl group, a cyclopropyl methyl group, 4-methyl cyclohexyl group, a cyclohexyl methyl group, a norbornyl group, and an adamantyl group, etc. Examples of an alkenyl group may include: a vinyl group, an allyl group, a propenyl group, a butenyl group, a hexenyl group, and a cyclohexenyl group, etc. Examples of an oxo alkyl group may include: 2-oxocyclopentyl group, 2-oxocyclohexyl group, 2-oxopropyl group, 2-cyclopentyl-2-oxoethyl group, 2-cyclohexyl-2-oxoethyl group, 2-(4-methylcyclohexyl)-2-oxoethyl group, etc. Examples of an oxoalkenyl group may include: 2-oxo-4-cyclohexenyl group, 2-oxo-4-propenyl group, etc. Examples of an aryl group may include: a phenyl group, a naphthyl group, etc.; and an alkoxy phenyl group such as p-methoxyphenyl group, m-methoxyphenyl group, o-methoxyphenyl group, an ethoxyphenyl group, p-tert-butoxyphenyl group and m-tert-butoxy phenyl group; an alkyl phenyl group such as 2-methylphenyl group, 3-methylphenyl group, 4-methylphenyl group, an ethylphenyl group, 4-tert butylphenyl group, 4-butylphenyl group, a dimethyl phenyl group, etc.; an alkyl naphthyl group such as a methylnaphthyl group, an ethyl naphthyl group, etc.; an alkoxy naphthyl group such as a methoxy naphthyl group, an ethoxy naphthyl group, etc.; a dialkyl naphthyl group such as a dimethyl naphthyl group, a diethyl naphthyl group, etc.; a dialkoxy naphthyl group such as a dimethoxy naphthyl group, a diethoxy naphthyl group, etc. Examples of the aralkyl group may include a benzyl group, a phenylethyl group, a phenethyl group, etc. Examples of an aryl oxoalkyl group may include: 2-aryl-2-oxoethyl group such as 2-phenyl-2-oxoethyl group, 2-(1-naphthyl)-2-oxoethyl group, 2-(2-naphthyl)-2-oxoethyl group, etc.

Examples of a non-nucleophilic counter ion as $K^-$ may include: a halide ion such as a chloride ion, a bromide ion, etc.; a fluoro alkyl sulfonate such as triflate, 1,1,1-trifluoro ethanesulfonate, nonafluoro butane sulfonate, etc.; an aryl sulfonate such as tosylate, benzene sulfonate, 4-fluorobenzene sulfonate, 1,2,3,4,5-pentafluoro benzene sulfonate, etc.; an alkyl sulfonate such as mesylate, butane sulfonate, etc.; imidic acid such as bis (trifluoromethyl sulfonyl)imide, bis (perfluoroethyl sulfonyl)imide, or bis(perfluorobutyl sulfonyl)imide; methide acid such as tris(trifluoromethyl sulfonyl) methide, or tris(perfluoroethyl sulfonyl)methide; sulfonates represented by the following general formula K-1 which are substituted with fluorine atoms at α position; and sulfonates represented by the following general formula K-2 which are substituted with fluorine atoms at α and β positions.

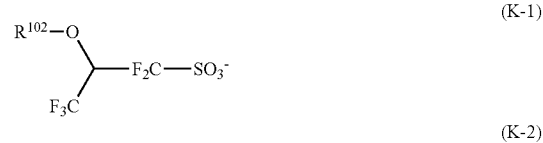

In the general formula (K-1), $R^{102}$ represents a hydrogen atom, a linear, branched or cyclic alkyl group, acyl group having 1-20 carbon atoms, an alkenyl group having 2-20 carbon atoms, an aryl group having 6-20 carbon atoms, or an aryloxy group.

In the general formula (K-2), $R^{103}$ represents a hydrogen atom, a linear, branched or cyclic alkyl group, acyl group having 1-20 carbon atoms, an alkenyl group having 2-20 carbon atoms, an aryl group having 6-20 carbon atoms.

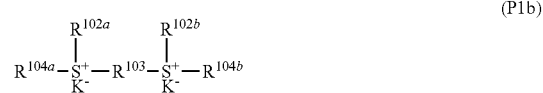

(In the formula, $R^{102a}$ and $R^{102b}$ each represents a linear, branched or cyclic alkyl group having 1-8 carbon atoms. $R^{103}$ represents a linear, branched or cyclic alkylene group having 1-10 carbon atoms. $R^{104a}$ and $R^{104b}$ each represents a 2-oxoalkyl group having 3-7 carbon atoms. $K^-$ represents a non-nucleophilic counter ion.)

Examples of the alkyl group of $R^{102a}$ and $R^{102b}$ may include: a methyl group, an ethyl group, a propyl group, an isopropyl group, n-butyl group, sec-butyl group, tert-butyl group, a pentyl group, a hexyl group, a heptyl group, an octyl group, a cyclopentyl group, a cyclohexyl group, a cyclopropylmethyl group, 4-methylcyclohexyl group, a cyclohexyl methyl group, etc.

Examples of the alkylene group of $R^{103}$ may include: a methylene group, an ethylene group, a propylene group, a butylene group, a pentylene group, a hexylene group, a heptylene group, an octylene group, a nonylene group, 1,4-cyclohexylene group, 1,2-cyclohexylene group, 1,3-cyclopentylene group, 1,4-cyclooctylene group, 1,4-cyclohexane dimethylene group, etc.

Examples of the 2-oxoalkyl group of $R^{104a}$ and $R^{104b}$ may include: 2-oxopropyl group, 2-oxocyclopentyl group, 2-oxocyclohexyl group, 2-oxocycloheptyl group, etc.

Examples of $K^-$ may include the same as mentioned in the formulae (P1a-1), (P1a-2).

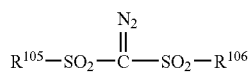
(P2)

(In the formula, $R^{105}$ and $R^{106}$ independently represent a linear, branched or cyclic alkyl group or a halogenated alkyl group having 1-12 carbon atoms, an aryl group or a halogenated aryl group having 6-20 carbon atoms, or an aralkyl group having 7-12 carbon atoms.)

Examples of an alkyl group as $R^{105}$ and $R^{106}$ may include: a methyl group, an ethyl group, a propyl group, an isopropyl group, n-butyl group, sec-butyl group, tert-butyl group, a pentyl group, a hexyl group, a heptyl group, an octyl group, an amyl group, a cyclopentyl group, a cyclohexyl group, a cycloheptyl group, a norbornyl group, an adamantyl group, etc.

Examples of a halogenated alkyl group as $R^{105}$ and $R^{106}$ may include: trifluoroethyl group, 1,1,1-trifluoroethyl group, 1,1,1-trichloroethyl group, a nonafluoro butyl group, etc. Examples of an aryl group may include: a phenyl group, an alkoxyphenyl group such as p-methoxyphenyl group, m-methoxyphenyl group, o-methoxyphenyl group, an ethoxyphenyl group, p-tert-butoxyphenyl group, m-tert-butoxyphenyl group, etc.; and an alkylphenyl group such as 2-methylphenyl group, 3-methylphenyl group, 4-methylphenyl group, an ethylphenyl group, 4-tert-butylphenyl group, 4-butylphenyl group, a diethylphenyl group, etc.

Examples of a halogenated aryl group as $R^{105}$ and $R^{106}$ may include: a fluorophenyl group, a chlorophenyl group, 1,2,3,4,5-pentafluoro phenyl group, etc.

Examples of an aralkyl group as $R^{105}$ and $R^{106}$ may include: a benzyl group, a phenethyl group, etc.

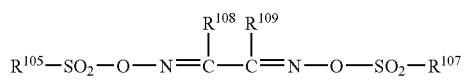
(P3)

(In the formula, $R^{107}$, $R^{108}$ and $R^{109}$ independently represent a linear, branched, cyclic alkyl group or halogenated alkyl group having 1-12 carbon atoms, an aryl group or a halogenated aryl group having 6-20 carbon atoms, or an aralkyl group having 7-12 carbon atoms. $R^{108}$ and $R^{109}$ may be bonded each other and form a cyclic structure. When they form a cyclic structure, $R^{108}$ and $R^{109}$ each independently represents a linear or branched alkylene group having 1-6 carbon atoms. $R^{105}$ represents the same group as that in the formula P2.)

Examples of the alkyl group, the halogenated alkyl group, the aryl group, the halogenated aryl group, and the aralkyl group as $R^{107}$, $R^{108}$ and $R^{109}$ may be the same as those explained for $R^{105}$ and $R^{106}$. Examples of an alkylene group for $R^{108}$ and $R^{109}$ may include: a methylene group, an ethylene group, a propylene group, a butylene group, a hexylene group, etc.

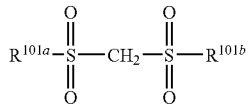
(P4)

(In the formula, $R^{101a}$ and $R^{101b}$ are the same as explained above.)

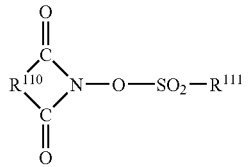
(P5)

(In the formula, $R^{110}$ represents an arylene group having 6-10 carbon atoms, an alkylene group having 1-6 carbon atoms or an alkenylene group having 2-6 carbon atoms. Some or all of hydrogen atoms of these groups may be further substituted with a linear or branched alkyl group or an alkoxy group having 1-4 carbon atoms, a nitro group, an acetyl group, or a phenyl group. $R^{111}$ represents a linear, branched or substituted alkyl group, alkenyl group or alkoxy alkyl group having 1-8 carbon atoms, a phenyl group or a naphthyl group. Some or all of hydrogen atoms of these groups may be substituted with an alkyl group or an alkoxy group having 1-4 carbon atoms; a phenyl group which may be substituted with an alkyl group or an alkoxy group having 1-4 carbon atoms, a nitro group or an acetyl group; a hetero aromatic group having 3-5 carbon atoms; or a chlorine atom or a fluorine atom.)

Examples of the arylene group as $R^{110}$ may include: 1,2-phenylene group, 1,8-naphtylene group, etc. Examples of the alkylene group may include: a methylene group, an ethylene group, a trimethylene group, a tetramethylene group, a phenylethylene group, a norbornane-2,3-di-yl group, etc. Examples of the alkenylene group may include: 1,2-vinylene group, 1-phenyl-1,2-vinylene group, 5-norbornene-2,3-di-yl group, etc.

Examples of the alkyl group as $R^{111}$ may be the same as those for $R^{101a}$-$R^{101c}$. Examples of the alkenyl group as $R^{111}$ may include: a vinyl group, a 1-propenyl group, an allyl group, a 1-butenyl group, a 3-butenyl group, an isoprenyl group, a 1-pentenyl group, a 3-pentenyl group, a 4-pentenyl group, a dimethyl allyl group, a 1-hexenyl group, a 3-hexenyl group, a 5-hexenyl group, a 1-heptenyl group, a 3-heptenyl group, a 6-heptenyl group, a 7-octenyl group, etc. Examples of the alkoxy alkyl group may include: a methoxy methyl group, an ethoxy methyl group, a propoxy methyl group, a butoxy methyl group, a pentyloxy methyl group, a hexyloxy methyl group, a heptyloxy methyl group, a methoxy ethyl group, an ethoxy ethyl group, a propoxy ethyl group, a butoxy ethyl group, a pentyloxy ethyl group, a hexyloxy ethyl group, a methoxy propyl group, an ethoxy propyl group, a propoxy propyl group, a butoxy propyl group, a methoxy butyl group, an ethoxy butyl group, a propoxy butyl group, a methoxy pentyl group, an ethoxy pentyl group, a methoxy hexyl group, a methoxy heptyl group, etc.

Examples of the alkyl group having 1-4 carbon atoms which may be further substituted may include: a methyl group, an ethyl group, a propyl group, an isopropyl group, an n-butyl group, an isobutyl group, a tert-butyl group, etc. Examples of the alkoxy group having 1-4 carbon atoms may include: a methoxy group, an ethoxy group, a propoxy group, an isopropoxy group, an n-butoxy group, an isobutoxy group, a tert-butoxy group, etc.

Examples of the phenyl group which may be substituted with an alkyl group and an alkoxy group having 1-4 carbon atoms, a nitro group or an acetyl group may include: a phenyl group, a tolyl group, a p-tert-butoxy phenyl group, a p-acetyl phenyl group, a p-nitrophenyl group, etc. Examples of a hetero aromatic group having 3-5 carbon atoms may include: a pyridyl group, a furyl group, etc.

Examples of the second acid generator may include: an onium salt such as tetramethyl ammonium trifluoromethane sulfonate, tetramethyl ammonium nonafluoro butane sulfonate, triethyl ammonium nonafluoro butane sulfonate, pyridinium nonafluoro butane sulfonate, triethyl ammonium camphor sulfonate, pyridinium camphor sulfonate, tetra n-butyl-ammonium nonafluoro butane sulfonate, tetraphenyl ammonium nonafluoro butane sulfonate, tetramethyl ammonium p-toluene sulfonate, diphenyl iodinium trifluoromethane sulfonate, (p-tert-butoxy phenyl)phenyl iodinium trifluoromethane sulfonate, diphenyl iodinium p-toluene sulfonate, (p-tert-butoxy phenyl)phenyl iodinium p-toluene sulfonate, triphenyl sulfonium trifluoromethane sulfonate, (p-tert-butoxy phenyl)diphenyl sulfonium trifluoromethane sulfonate, bis(p-tert-butoxy phenyl)phenyl sulfonium trifluoromethane sulfonate, tris(p-tert-butoxy phenyl)sulfonium trifluoromethane sulfonate, triphenyl sulfonium p-toluene sulfonate, (p-tert-butoxy phenyl)diphenyl sulfonium p-toluene sulfonate, bis(p-tert-butoxy phenyl)phenyl sulfonium p-toluene sulfonate, tris(p-tert-butoxy phenyl)sulfonium p-toluene sulfonate, triphenyl sulfonium nonafluoro butane sulfonate, triphenyl sulfonium butane sulfonate, trimethyl sulfonium trifluoromethane sulfonate, trimethyl sulfonium p-toluene sulfonate, cyclohexyl methyl (2-oxocyclohexyl)sulfonium trifluoromethane sulfonate, cyclohexyl methyl (2-oxo cyclohexyl)sulfonium p-toluene sulfonate, dimethyl phenyl sulfonium trifluoromethane sulfonate, dimethyl phenyl sulfonium p-toluene sulfonate, dicyclohexyl phenyl sulfonium trifluoromethane sulfonate, dicyclohexyl phenyl sulfonium p-toluene sulfonate, trinaphthylsulfonium trifluoromethane sulfonate, (2-norbonyl)methyl (2-oxocyclohexyl)sulfonium trifluoromethane sulfonate, ethylene bis [methyl (2-oxocyclopentyl)sulfonium trifluoromethane sulfonate], 1,2'-naphthyl carbonyl methyl-tetrahydro thiophenium triflate, triethyl ammonium nonaflate, tributyl ammonium nonaflate, tetraethyl ammonium nonaflate, tetrabutyl ammonium nonaflate, triethyl ammonium bis (trifluoromethylsulfonyl)imide, triethyl ammonium tris (perfluoroethylsulfonyl)methide, etc.

Examples of a diazomethane derivative may include: bis (benzene sulfonyl) diazomethane, bis(p-toluene sulfonyl) diazomethane, bis(xylene sulfonyl) diazomethane, bis(cyclohexyl sulfonyl) diazomethane, bis(cyclopentyl sulfonyl) diazomethane, bis(n-butylsulfonyl) diazomethane, bis(isobutyl sulfonyl) diazomethane, bis(sec-butylsulfonyl) diazomethane, bis(n-propylsulfonyl) diazomethane, bis(isopropyl sulfonyl) diazomethane, bis(tert-butyl-sulfonyl) diazomethane, bis(n-amylsulfonyl) diazomethane, bis (isoamylsulfonyl) diazomethane, bis(sec-amylsulfonyl) diazomethane, bis(tert-amylsulfonyl)diazomethane, 1-cyclohexylsulfonyl-1-(tert-butyl-sulfonyl) diazomethane, 1-cyclohexyl sulfonyl-1-(tert-amyl sulfonyl) diazomethane, 1-tert-amyl sulfonyl-1-(tert-butyl-sulfonyl) diazomethane, etc.

Examples of a glyoxime derivative may include: bis-O-(p-toluene sulfonyl)-α-dimethylglyoxime, bis-O-(p-toluene sulfonyl)-α-diphenyl glyoxime, bis-O-(p-toluene sulfonyl)-α-dicyclohexyl glyoxime, bis-O-(p-toluene sulfonyl)-2,3-pentanedione glyoxime, bis-O-(p-toluene sulfonyl)-2-methyl-3,4-pentanedione glyoxime, bis-O-(n-butane sulfonyl)-α-dimethylglyoxime, bis-O-(n-butane sulfonyl)-α-diphenyl glyoxime, bis-O-(n-butane sulfonyl)-α-dicyclohexyl glyoxime, bis-O-(n-butane sulfonyl)-2,3-pentanedione glyoxime, bis-O-(n-butane sulfonyl)-2-methyl-3,4-pentanedione glyoxime, bis-O-(methane sulfonyl)-α-dimethylglyoxime, bis-O-(trifluoromethane sulfonyl)-α-dimethylglyoxime, bis-O-(1,1,1-trifluoro ethane sulfonyl)-α-dimethylglyoxime, bis-O-(tert-butane sulfonyl)-α-dimethylglyoxime, bis-O-(perfluoro octane sulfonyl)-α-dimethylglyoxime, bis-O-(cyclohexane sulfonyl)-α-dimethylglyoxime, bis-O-(benzene sulfonyl)-α-dimethylglyoxime, bis-O-(p-fluorobenzene sulfonyl)-α-dimethylglyoxime, bis-O-(p-tert-butylbenzene sulfonyl)-α-dimethylglyoxime, bis-O-(xylene sulfonyl)-α-dimethylglyoxime, bis-O-(camphor sulfonyl)-α-dimethylglyoxime, etc.

Examples of a bissulfone derivative may include: bis naphthyl sulfonyl methane, bis-trifluoro methyl sulfonyl methane, bis methyl sulfonyl methane, bis ethyl sulfonyl methane, bis propyl sulfonyl methane, bis isopropyl sulfonyl methane, bis-p-toluene sulfonyl methane, bis benzene sulfonyl methane, etc.

Examples of the β-ketosulfone derivative may include: 2-cyclohexyl carbonyl-2-(p-toluene sulfonyl)propane, 2-isopropyl carbonyl-2-(p-toluene sulfonyl)propane, etc.

Examples of the disulfone derivative may include: a diphenyl disulfone derivative, a diycyclohexyl disulfone derivative, etc.

Examples of the nitro benzyl sulfonate derivative may include: 2,6-dinitro benzyl p-toluenesulfonate, 2,4-dinitro benzyl p-toluenesulfonate, etc.

Examples of the sulfonate derivative may include: 1,2,3-tris(methane sulfonyloxy)benzene, 1,2,3-tris(trifluoromethane sulfonyloxy)benzene, 1,2,3-tris(p-toluene sulfonyloxy)benzene, etc.

Examples of the sulfonate derivative of N-hydroxy imide compound may include: N-hydroxy succinimide methane sulfonate, N-hydroxy succinimide trifluoromethane sulfonate, N-hydroxy succinimide ethane sulfonate, N-hydroxy succinimide 1-propane sulfonate, N-hydroxy succinimide 2-propane sulfonate, N-hydroxy succinimide 1-pentane sulfonate, N-hydroxy succinimide 1-octane sulfonate, N-hydroxy succinimide p-toluenesulfonate, N-hydroxy succinimide p-methoxybenzene sulfonate, N-hydroxy succinimide 2-chloroethane sulfonate, N-hydroxy succinimide benzenesulfonate, N-hydroxy succinimide-2,4,6-trimethyl benzene sulfonate, N-hydroxy succinimide 1-naphthalene sulfonate, N-hydroxy succinimide 2-naphthalene sulfonate, N-hydroxy-2-phenyl succinimide methane sulfonate, N-hydroxy maleimide methane sulfonate, N-hydroxy maleimide ethane sulfonate, N-hydroxy-2-phenyl maleimide methane sulfonate, N-hydroxy glutarimide methane sulfonate, N-hydroxy glutarimide benzenesulfonate, N-hydroxy phthalimide methane sulfonate, N-hydroxy phthalimide benzenesulfonate, N-hydroxy phthalimide trifluoromethane sulfonate, N-hydroxy phthalimide p-toluenesulfonate, N-hydroxy naphthalimide methane sulfonate, N-hydroxy naphthalimide benzenesulfonate, N-hydroxy-5-norbornene- 2,3-dicarboxyimide methane sulfonate, N-hydroxy-5-norbornene-2,3-dicarboxyimide trifluoromethane sulfonate, N-hydroxy-5-norbornene-2,3-dicarboxyimide p-toluenesulfonate, etc.

Suitable examples thereof may include: an onium salt such as triphenyl sulfonium trifluoromethane sulfonate, (p-tert-butoxy phenyl)diphenyl sulfonium trifluoromethane sulfonate, tris(p-tert-butoxy phenyl)sulfonium trifluoromethane sulfonate, triphenyl sulfonium p-toluene sulfonate, (p-tert-butoxy phenyl)diphenyl sulfonium p-toluene sulfonate, tris(p-tert-butoxy phenyl)sulfonium p-toluene sulfonate, trinaphthylsulfonium trifluoromethane sulfonate, cyclohexyl methyl (2-oxocyclohexyl)sulfonium trifluoromethane sulfonate, (2-norbonyl)methyl (2-oxocyclohexyl)sulfonium trifluoromethane sulfonate, 1,2'-naphthyl carbonylmethyl tetrahydrothiophenium triflate, etc.;

a diazomethane derivative such as bis(benzene sulfonyl) diazomethane, bis(p-toluene sulfonyl) diazomethane, bis(cyclohexyl sulfonyl) diazomethane, bis(n-butylsulfonyl) diazomethane, bis(isobutyl sulfonyl) diazomethane, bis(sec-butylsulfonyl) diazomethane, bis(n-propyl sulfonyl) diazomethane, bis(isopropyl sulfonyl) diazomethane, bis (tert-butylsulfonyl) diazomethane, etc.;

a glyoxime derivative, such as bis-O-(p-toluene sulfonyl)-α-dimethylglyoxime, bis-O-(n-butane sulfonyl)-α-dimethylglyoxime, etc.;

a bissulfone derivative, such as bisnaphthyl sulfonyl methane;

a sulfonate derivative of N-hydroxyimide compounds, such as N-hydroxy succinimide methane sulfonate, N-hydroxy succinimide trifluoromethane sulfonate, N-hydroxy succinimide 1-propane sulfonate, N-hydroxy succinimide 2-propane sulfonate, N-hydroxy succinimide 1-pentane sulfonate, N-hydroxy succinimide p-toluene sulfonate, N-hydroxy naphthalimide methane sulfonate, N-hydroxy naphthalimide benzene sulfonate, etc.

Incidentally, the second acid generator may be used alone or in admixture.

An amount of the second acid generator to be added is preferably 0 to 50 parts by mass, more preferably 0 to 40 parts by mass per 100 parts by mass of the base polymer. The acid generator can pyrolytically decompose partially in a heating process for hardening a silicon-containing antireflection film. An amount of the pyrolysis varies depending on hardening temperature and processing time. The amount of the pyrolysis of the second acid generator with the temperature and the time is preferably 50% or less, more preferably 10% or less, and most preferably 1% or less.

By the way, neutralizer may be added to the antireflection film composition according to the present invention.

The neutralizer is a composition that prevents generated acid from diffusing to a photoresist film to be applied in the subsequent step. Examples of the neutralizer may include: an epoxy compound, a melamine compound, a guanamine compound, a glycol uryl compound and an urea compound, substituted by at least one group selected from a group consisting of a methylol group, an alkoxy ethyl group, and acyloxy ethyl group, and so on.

Examples of the epoxy compound among the neutralizer include: tris(2,3-epoxy propyl)isocyanurate, tri methylol methane tri glycidyl ether, trimethylol propane tri glycidyl ether, tri ethylol ethane triglycidyl ether, and the like.

Illustrative examples of the melamine compound among the neutralizer include: hexamethylol melamine, hexamethoxy ethyl melamine, a compound in which 1-6 of methylol groups of hexamethylol melamine is methoxy ethylated and a mixture thereof, hexamethoxy ethyl melamine, hexaacyloxy ethyl melamine, and a compound in which 1-5 of methylol groups of hexamethylol melamine is acyloxy ethylated and a mixture thereof.

Examples of a guanamine compound among the neutralizer include: tetramethylol guanamine, tetra methoxy ethyl guanamine, a compound in which 1-4 of methylol groups of a tetramethylol guanamine is methoxy ethylated and a mixture thereof, tetra methoxy ethyl guanamine, tetra acyloxy guanamine, and a compound in which 1-4 of methylol groups of tetramethylol guanamine is acyloxy ethylated and a mixture thereof.

Examples of a glycol uryl compound among the neutralizer include: tetramethylol glycol uryl, tetra methoxy glycol uryl, tetra methoxy ethyl glycol uryl, a compound in which 1-4 of the methylol groups of tetramethylol glycol uryl is metoxy ethylated and a mixture thereof, and a compound in which 1-4 of the methylol groups of tetrametylol glycol uryl is acyloxy ethylated and a mixture thereof.

Examples of an urea compound among the neutralizer include: tetramethylol urea, tetramethoxy methyl urea, and a compound in which 1-4 of methylol groups of tetramethylol urea are methoxy ethylated and a mixture thereof.

An amount of the neutralizer to be added is preferably 0 to 50 parts (hereinafter, parts means parts by mass), more preferably 0 to 40 parts per 100 parts of the light absorbing silicone resin.

FIG. 1 is a schematic section view of one embodiment of a substrate according to the present invention.

A substrate 10 according to the present invention comprises an antireflection film 11 formed with the antireflection film composition according to the present invention, and a photoresist film 12 over the antireflection film 11.

Generally known photoresist film compositions, preferably compositions for forming positive photoresist films, can be used for forming the photoresist film 12. For example, base resin, organic solvent, and acid generator may be combined and used as the composition. Examples of the base resin may include one or more polymer(s) selected from the group: polyhydroxystyrene and its derivatives; polyacrylic acid and its derivatives; polymethacrylic acid and its derivatives; copolymer synthesized with selecting monomers from hydroxystyrene, acrylic acid, methacrylic acid and derivatives thereof; copolymer synthesized with selecting three or more monomers from cycloolefin and its derivatives, maleic anhydride, and acrylic acid and its derivatives; copolymer synthesized with selecting three or more monomers from cycloolefin and its derivatives, maleimide, and acrylic acid and its derivatives; polynorbornene; and ring-opening metathesis polymer. Incidentally, the derivatives as mentioned above each has its original main skeleton after being derived. For example, acrylic acid derivatives include acrylate and so on, methacrylic acid derivatives include methacrylate and so on, and hydroxystyrene derivatives include alkoxystyrene and so on.

In particular, photoresist film compositions for KrF excimer laser may include: polyhydroxystyrene (PHS), copolymer synthesized with selecting monomers from hydroxystyrene, styrene, acrylate, methacrylate and maleimide N carboxylate. Photoresist film compositions for ArF excimer laser may include: polyacrylates, polymethacrylates, alternating copolymers of norbornene and maleic anhydride, alternating copolymers of tetracyclododecene and maleic anhydride, polynorbornenes, and ring-opening metathesis polymers. However, photoresist film compositions are not restricted thereto.

In positive photoresist film compositions, a dissolution rate at non-exposed areas are generally decreased by substituting a hydroxy group of phenol or a carboxyl group with an acid labile group. That is, a base resin in which a hydrogen atom of a carboxyl group or a hydrogen atom of a phenolic hydroxy group is substituted with an acid labile group with the capability of controlling alkali solubility; and an acid generated upon exposure cleaves the acid labile group to enhance solubility to aqueous alkaline solutions is combined with other components to provide positive photoresist film composition.

As for an organic solvent for photoresist film compositions, the above-mentioned organic solvents for antireflection film compositions can be used. As for an acid generator, general acid generators can be used. As for an addition amount of each component in photoresist film composition, for example, an addition amount of the base resin is as with an addition amount of silicone resin in the antireflection film composition according to the present invention; and an addition amount of the organic solvent and the acid generator for photoresist film compositions is as with an addition amount of the organic solvent and the acid generator for the antireflection film compositions.

As shown in FIG. 1, the substrate 10 may consist of a base layer 10b and a process layer 10a.

In this case, the base layer 10b of the substrate 10 is not limited but may be Si, α-Si, p-Si, $SiO_2$, SiN, SiON, W, TiN, Al, etc., and a different material from a process layer (a substrate to be processed) 10a may be used. As the process layer 10a, Si, $SiO_2$, SION, SiN, p-Si, α-Si, W, W—Si, Al, Cu, Al—Si, etc., various low dielectric constant films, and an etching stopper film thereof may be used, and it may be formed generally at a thickness of 50 to 10,000 nm, especially at a thickness of 100 to 5,000 nm.

Figure 2:
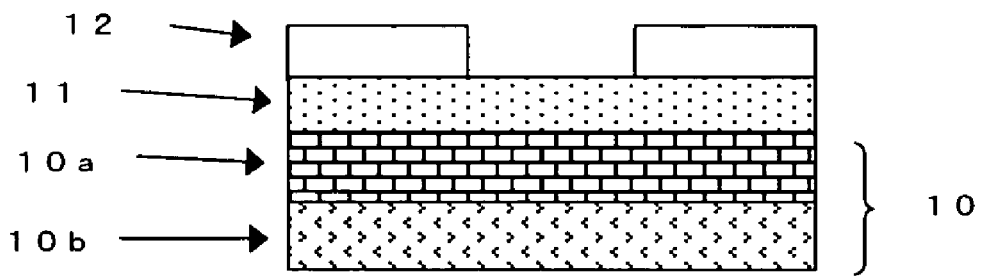
FIG. 2 is a schematic explanatory view of one embodiment of a patterning process according to the present invention.
Figure 2:
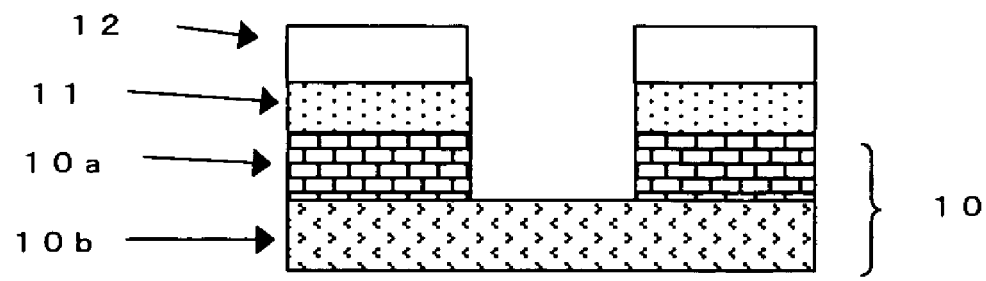

FIG. 2 is a schematic explanatory view of one embodiment of a patterning process according to the present invention.

Firstly, the processes up to forming a resist pattern in FIG. 2(a) will be explained.

An antireflection film 11 can be formed over the substrate 10 by applying to the substrate by spin-coating etc. the antireflection film composition according to the present invention. After the application by spin-coating etc., the composition is preferably baked to promote a crosslinking reaction in order to evaporate organic solvents and to prevent the antireflection film from intermixing with an overlying photoresist film 12. The baking is preferably carried out at a temperature in a range of 80 to 300 degrees C., for 10 to 300 seconds.

After the antireflection film 11 is formed, the photoresist film 12 is formed thereon. For forming the photoresist film 12, spin-coating is also preferably used as with forming the antireflection film 11. After a photoresist film composition is applied by spin-coating etc., the composition is pre-baked. The pre-baking is preferably carried out at a temperature in a range of 80 to 180 degrees C., for 10 to 300 seconds.

Then, a pattern circuit area of the photoresist film 12 is exposed, and post exposure baking (PEB) and development with a developer are carried out to obtain a resist pattern.

Secondly, the processes up to patterning in FIG. 2(b) will be explained.

In order to etch the antireflection film 11 with using the photoresist film 12 as a mask, etching is performed by using flon gases, nitrogen gas, carbon dioxide gas, or the like. As a result, the antireflection film 11 is patterned.

Next, etching of the substrate 10 is carried out with using the patterned antireflection film 11 as a mask. When the process layer 10a over the base layer 10b is $SiO_2$ or SiN, a flon gas is mainly used in the etching. When the process layer 10a is p-type Si (p-Si), Al or W, a chlorine gas or a bromine gas is mainly used in the etching. As a result, the substrate 10 is patterned.

Incidentally, when the substrate 10 is patterned by etching, the substrate may be patterned by etching the substrate with using a patterned antireflection film as a mask as mentioned above, or the substrate may be patterned by etching the antireflection film and the substrate with using a photoresist film on which a resist pattern is formed as a mask.

Figure 3:
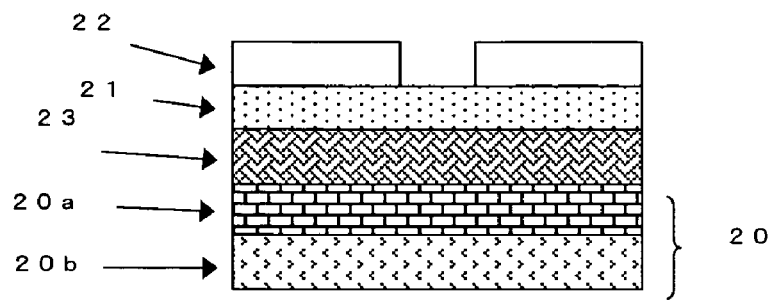
FIG. 3 is a schematic explanatory view of another embodiment of a patterning process according to the present invention.
Figure 3:
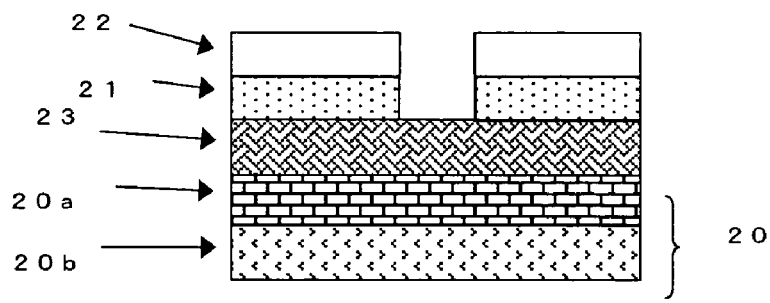
Figure 3:
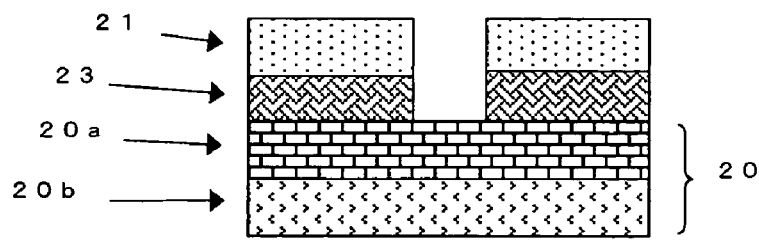
Figure 3:
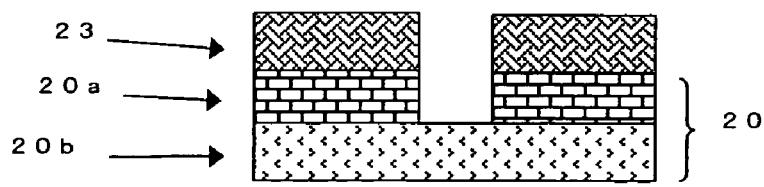

Next, FIG. 3 is a schematic explanatory view of another embodiment of a patterning process according to the present invention.

Firstly, the processes up to forming a resist pattern in FIG. 3(a) will be explained.

An organic film 23 is formed by spin-coating etc. over a substrate 20 comprising a base layer 20b and a process layer 20a. The organic film 23 preferably has high etching resistance under conditions etching substrates because the organic film 23 functions as a mask when the substrate 20 is etched. The organic film 23 is also preferably crosslinked by heat or acid after application by spin-coating etc. because the organic film is required not to mix with an overlying antireflection film 21 as much as possible.

Examples of resin for forming the organic film may include: cresol-novolac, naphthol-novolac, naphtholdicyclopentadien-novolac, amorphous carbon, polyhydroxystyrene, acrylate, methacrylate, polyimide, polysulfone and so on.

After that, the antireflection film composition according to the present invention is applied to the organic film 23, and baked to form an antireflection film 21. A photoresist film composition is applied to the antireflection film, and pre-baked to form a photoresist film 22. The antireflection film 21 and the photoresist film 22 are formed as with above.

Then, a pattern circuit area is exposed, and development with a developer is carried out to obtain a resist pattern on the photoresist film 22.

Next, as shown in FIG. 3(b), the antireflection film 21 is etched with using the patterned photoresist film 22 as a mask to transfer the resist pattern to the antireflection film 21.

Then, as shown in FIG. 3(c), the pattern formed on the antireflection film 21 is transferred to the organic film 23 by oxygen plasma etching or the like. At this time, the photoresist film 22 is also etched and removed.

After that, as shown in FIG. 3(d), the substrate 20 is etched with using the patterned organic film 23 as a mask, whereby the pattern is formed on the substrate 20.

A thickness of each film are, for example, 50 to 2000 nm for the organic film, 5 to 2000 nm for the antireflection film (preferably 10 to 100 nm, more preferably 10 to 60 nm thick thin film), and 0.1 to 1 μm (preferably, 100 to 500 nm) for the photoresist film. However, each thickness is not limited thereto.

EXAMPLE

Hereinafter, the present invention will be explained further in detail with reference to Examples, Comparative Examples and so on. However, the present invention is not limited by these descriptions.

Synthetic Example 1

In a 3000 ml glass flask, 1400 g of ethanol, 700 g of deionized water, and 50 g of 25% tetraethylammonium hydroxide were placed, and stirred. To this mixture was added dropwise a mixture of 52 g of 2-(3,4-epoxycyclohexyl) ethyl trimethoxy silane, 14 g of phenyl trimethoxy silane, 29 g of methyl trimethoxy silane, and 44 g of tetraethoxy silane at a liquid temperature of 40 degrees C. After that, the solution was stirred for 2 hours at 40 degrees C. After the reaction finished, the reaction was quenched by adding 35 g of acetic acid, and ethanol was removed under a reduced pressure. To thus-obtained solution was added 2000 ml of ethyl acetate, and a water layer was separated. An organic layer was washed twice with ultrapure water. To this contents was added 600 g of propylene glycol monoethyl ether acetate (PGMEA), and the contents were heated up to a liquid temperature of 40 degrees C. to give Polymer 1.

Mass-average molecular weight (Mw) relative to polystyrene standard etc. of Polymer 1 were measured by gel permeation chromatography (GPC). Copolymerization Ratio of Polymer 1 was measured by $^{13}$C-NMR. The results are shown below.

In Polymer 1, components having molecular weight of less than 600 accounted for 0% of the whole resin.

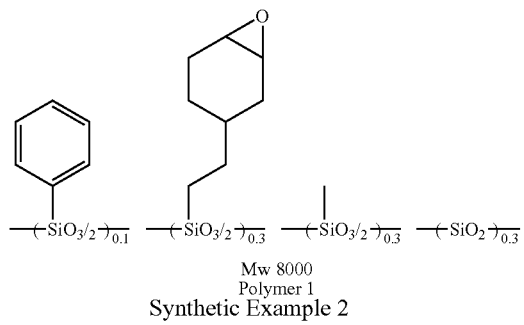

Mw 8000
Polymer 1

Synthetic Example 2

In a 3000 ml glass flask, 1400 g of ethanol, 700 g of deionized water, and 50 g of 25% tetraethylammonium hydroxide were placed, and stirred. To this mixture was added dropwise a mixture of 52 g of 2-(3,4-epoxycyclohexyl) ethyl trimethoxy silane, 14 g of phenyl trimethoxy silane, 29 g of methyl trimethoxy silane, and 44 g of tetraethoxy silane at a liquid temperature of 20 degrees C. After that, the solution was stirred for 2 hours at 20 degrees C. After the reaction finished, the reaction was quenched by adding 35 g of acetic acid, and ethanol was removed under a reduced pressure. To thus-obtained solution was added 2000 ml of ethyl acetate, and a water layer was separated. An organic layer was washed twice with ultrapure water. To this contents was added 600 g of propylene glycol monoethyl ether acetate (PGMEA), and the contents were heated up to a liquid temperature of 40 degrees C. to give Polymer 2.

Mass-average molecular weight (Mw) relative to polystyrene standard etc. of Polymer 2 were measured by gel permeation chromatography (GPC). Copolymerization Ratio of Polymer 2 was measured by $^{13}$C-NMR. The results are shown below.

In Polymer 2, components having molecular weight of less than 600 accounted for 5% of the whole resin.

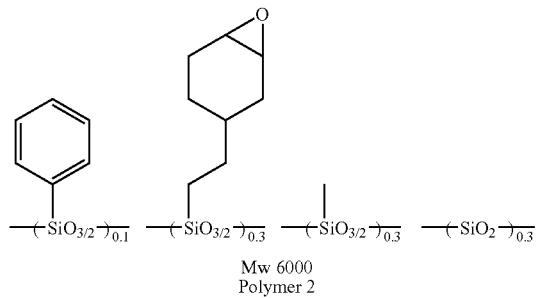

Mw 6000
Polymer 2

Synthetic Example 3

In a 1000 ml glass flask, 400 g of ethanol, 45 g of 2-(3,4-epoxycyclohexyl)ethyl trimethoxy silane, 14 g of phenyl trimethoxy silane, 31 g of methyl trimethoxy silane, 47 g of tetraethoxy silane and 10 g of acetic acid were placed, and stirred. To this mixture was added dropwise a mixture of 40 g of ethanol and 40 g of deionized water at a liquid temperature of 40 degrees C. After that, the solution was stirred for 24 hours at 40 degrees C. After the reaction finished, ethanol was removed under a reduced pressure. To thus-obtained solution was added 600 g of propylene glycol monoethyl ether acetate (PGMEA), and the contents were heated up to a liquid temperature of 40 degrees C. to give Polymer 3.

Mass-average molecular weight (Mw) relative to polystyrene standard etc. of Polymer 3 were measured by gel permeation chromatography (GPC). Copolymerization Ratio of Polymer 3 was measured by $^{13}$C-NMR. The results are shown below.

In Polymer 3, components having molecular weight of less than 600 accounted for 20% of the whole resin.

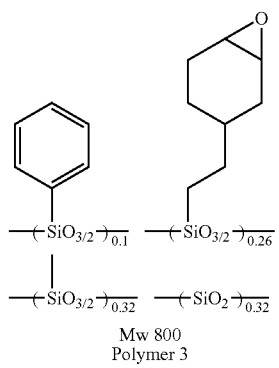

Mw 800
Polymer 3

Synthetic Example 4

Polymer 4 was obtained as with Synthetic Example 1 except that a mixture of 45 g of 2-(3,4-epoxycyclohexyl)ethyl trimethoxy silane, 14 g of phenyl trimethoxy silane, 31 g of methyl trimethoxy silane, and 47 g of tetraethoxy silane was used instead of a mixture of 139 g of 2-(3,4-epoxycyclohexyl) ethyl trimethoxy silane and 32 g of phenyl trimethoxy silane, and the reaction temperature was 60 degrees C.

Molecular weight (Mw) relative to polystyrene standard of Polymer 4 was measured by gel permeation chromatography (GPC). Copolymerization Ratio of Polymer 4 was measured by $^{13}$C-NMR. The results are shown below.

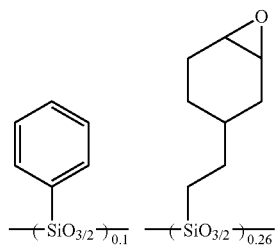

-continued

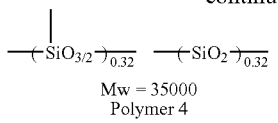
Mw = 35000
Polymer 4

Synthetic Example 5

Polymer 5 was obtained as with Synthetic Example 4 except that the reaction temperature was 40 degrees C.

Molecular weight (Mw) relative to polystyrene standard of Polymer 5 was measured by gel permeation chromatography (GPC). Copolymerization Ratio of Polymer 5 was measured by $^{13}$C-NMR. The results are shown below.

In Polymer 5, components having molecular weight of less than 600 accounted for 0% of the whole resin.

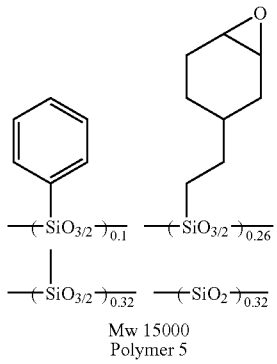
Mw 15000
Polymer 5

Example 1

First, a composition (28 parts by mass of a resin, and 100 parts by mass of a solvent) of 4,4'-(9H-fluorene-9-ylidene) bisphenol novolac resin (molecular weight: 11000) was spin-coated on a substrate, and was heated at 200 degrees C. for 1 minute to form an organic film with a thickness of 300 nm.

Second, an antireflection film composition was spin-coated on the organic film, and heated for 60 seconds at 200 degrees C. to form an antireflection film with a thickness of 100 nm.

The antireflection film composition used at this time contained 100 parts by mass of Polymer 1 obtained in Synthetic Example 1, 2000 parts by mass of an organic solvent (PG-MEA), 1 part by mass of a first acid generator: benzyltributylammonium chloride referred to as AG1, which is decomposed at a temperature of 164 degrees C., and 1 part by mass of a surfactant (FC4430 manufactured by Sumitomo 3M).

Then a photoresist film composition with the following composition was spin-coated on the antireflection film, and pre-baked for 60 seconds at 120 degrees C. to form a photoresist film with a thickness of 250 nm.

The composition of the photoresist film composition is as follows.

Resin: 10 parts by mass of Polymer A (see the following structural formula)

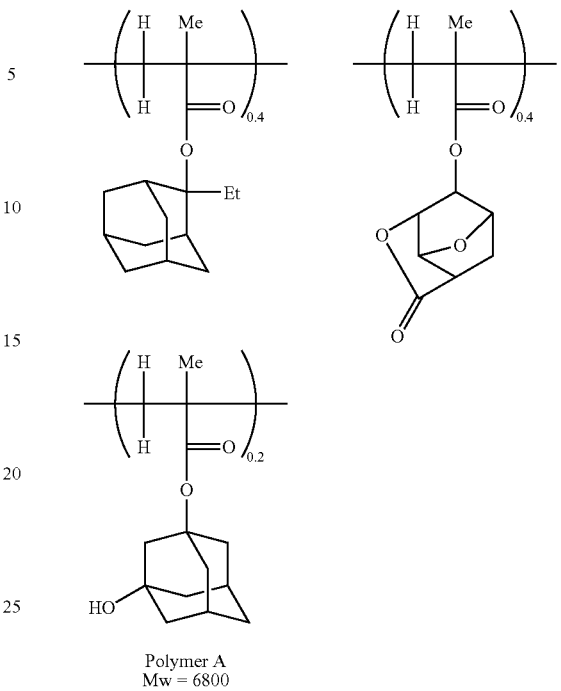
Polymer A
Mw = 6800

Me represents a methyl group, and Et represents an ethyl group.

Photo Acid Generator: 0.2 parts by mass of triphenyl sulfonium nonafluoro butane sulfonate Basic Additive: 0.02 parts by mass of triethanolamine Solvent: 600 parts by mass of PGMEA As described above, a substrate with an organic film, an antireflection film on the organic film, and a photoresist film on the antireflection film was prepared.

The intermixing phenomenon was not observed in the vicinity of the antireflection film/photoresist film interface.

Subsequently, pattern circuit areas of the photoresist film was exposed with the ArF exposure system (S305B, NA0.68, σ0.85, ⅔ annular illumination, a Cr mask, manufactured by Nikon Corporation), baked for 90 seconds at 110 degrees C., and developed in 2.38 mass % aqueous solution of tetra methyl ammonium hydroxide (TMAH), to obtain a 90 nm line/space pattern.

Observation of thus-obtained positive resist pattern revealed that there was no footing profile and so on, and that the pattern had a square profile, namely a vertical wall profile.

Next, the antireflection film was etched under dry etching conditions in which the antireflection film has sufficiently higher etching rate than organic compositions with using the resist pattern as an etching mask. A dry-etching-system TE-8500P manufactured by Tokyo Electron, Ltd. was used, and the etching conditions were as follows. Chamber Pressure: 40 Pa, RF Power: 1,300 W, Gap: 9 mm, CHF$_3$ Gas Flow Rate: 30 ml/min, CF$_4$ Gas Flow Rate: 30 ml/min, Ar Gas Flow Rate: 100 ml/min In this way, the antireflection film was etched by the dry etching to form a pattern on the antireflection film while pattern deformation due to side etching of the photoresist film hardly influenced the pattern.

After that, the substrate having the pattern-transferred antireflection film was etched under dry etching conditions in which the underlying organic film has sufficiently higher etching rate than the antireflection film. The etching was conducted by reactive dry etching with oxygen plasma, and the etching conditions were as follows.

Chamber Pressure: 60 Pa, RF Power: 600 W, Ar Gas Flow Rate: 40 sccm, $O_2$ Gas Flow Rate: 60 sccm, Gap: 9 mm By the reactive dry etching, the exposed pattern obtained as the resist pattern was transferred to the underlying organic film precisely.

Subsequently, the substrate was etched with using the pattern-transferred organic film as an etching mask to form a pattern on the substrate. At this time, because the process layer of the substrate was made of silicon oxide, dry etching conditions using fluoride gas was used. With the dry etching conditions, the process layer of the substrate was patterned and the antireflection film on the organic film was also etched and removed.

After that, the organic film remaining on the substrate was removed by oxygen gas plasma etching.

The pattern formed on the substrate was observed and it was confirmed that an excellent pattern was formed.

Example 2

First, a composition (28 parts by mass of a resin, and 100 parts by mass of a solvent) of 4,4'-(9H-fluorene-9-ylidene) bisphenol novolac resin (molecular weight: 11000) was spin-coated on a substrate, and was heated at 200 degrees C. for 1 minute to form an organic film with a thickness of 300 nm.

Second, an antireflection film composition was spin-coated on the organic film, and heated for 60 seconds at 200 degrees C. to form an antireflection film with a thickness of 100 nm.

The antireflection film composition used at this time contained 100 parts by mass of Polymer 5 obtained in Synthetic Example 5, 2000 parts by mass of an organic solvent (PGMEA), 1 part by mass of a first acid generator: benzyltributylammonium chloride, which is decomposed at a temperature of 164 degrees C., and 1 part by mass of a surfactant (FC4430 manufactured by Sumitomo 3M).

Then a substrate with an organic film, an antireflection film on the organic film, and a photoresist film on the antireflection film was prepared as with Example 1.

The intermixing phenomenon was not observed in the vicinity of the antireflection film/photoresist film interface.

Subsequently, pattern circuit areas of the photoresist film was exposed with the ArF exposure system (S305B, NA0.68, σ0.85, ⅔ annular illumination, a Cr mask, manufactured by Nikon Corporation), baked for 90 seconds at 110 degrees C., and developed in 2.38 mass % aqueous solution of tetra methyl ammonium hydroxide (TMAH), to obtain a 90 nm line/space pattern.

Observation of thus-obtained positive resist pattern revealed that there was no footing profile and so on, and that the pattern had a square profile, namely a vertical wall profile.

Next, the antireflection film was etched under dry etching conditions in which the antireflection film has sufficiently higher etching rate than organic compositions with using the resist pattern as an etching mask. A dry-etching-system TE-8500P manufactured by Tokyo Electron, Ltd. was used, and the etching conditions were as follows.

Chamber Pressure: 40 Pa, RF Power: 1,300 W, Gap: 9 mm, $CHF_3$ Gas Flow Rate: 30 ml/min, $CF_4$ Gas Flow Rate: 30 ml/min, Ar Gas Flow Rate: 100 ml/min In this way, the antireflection film was etched by the dry etching to form a pattern on the antireflection film while pattern deformation due to side etching of the photoresist film hardly influenced the pattern.

After that, the substrate having the pattern-transferred antireflection film was etched under dry etching conditions in which the underlying organic film has sufficiently higher etching rate than the antireflection film. The etching was conducted by reactive dry etching with oxygen plasma, and the etching conditions were as follows.

Chamber Pressure: 60 Pa, RF Power: 600 W, Ar Gas Flow Rate: 40 sccm, $O_2$ Gas Flow Rate: 60 sccm, Gap: 9 mm By the reactive dry etching, the exposed pattern obtained as the resist pattern was transferred to the underlying organic film precisely.

Subsequently, the substrate was etched with using the pattern-transferred organic film as an etching mask to form a pattern on the substrate. At this time, because the process layer of the substrate was made of silicon oxide, dry etching conditions using fluoride gas was used. With the dry etching conditions, the process layer of the substrate was patterned and the antireflection film on the organic film was also etched and removed.

After that, the organic film remaining on the substrate was removed by oxygen gas plasma etching.

The pattern formed on the substrate was observed and it was confirmed that an excellent pattern was formed.

Example 3

First, a composition (28 parts by mass of a resin, and 100 parts by mass of a solvent) of 4,4'-(9H-fluorene-9-ylidene) bisphenol novolac resin (molecular weight: 11000) was spin-coated on a substrate, and was heated at 200 degrees C. for 1 minute to form an organic film with a thickness of 300 nm.

Second, an antireflection film composition was spin-coated on the organic film, and heated for 60 seconds at 200 degrees C. to form an antireflection film with a thickness of 100 nm.

The antireflection film composition used at this time contained 100 parts by mass of Polymer 2 obtained in Synthetic Example 2, 2000 parts by mass of an organic solvent (PGMEA), 1 part by mass of a first acid generator: benzyltributylammonium chloride, which is decomposed at a temperature of 164 degrees C., and 1 part by mass of a surfactant (FC4430 manufactured by Sumitomo 3M).

Then a substrate with an organic film, an antireflection film on the organic film, and a photoresist film on the antireflection film was prepared as with Example 1.

The intermixing phenomenon was not observed in the vicinity of the antireflection film/photoresist film interface.

Subsequently, pattern circuit areas of the photoresist film was exposed with the ArF exposure system (S305B, NA0.68, σ0.85, ⅔ annular illumination, a Cr mask, manufactured by Nikon Corporation), baked for 90 seconds at 110 degrees C., and developed in 2.38 mass % aqueous solution of tetra methyl ammonium hydroxide (TMAH), to obtain a 90 nm line/space pattern.

Observation of thus-obtained positive resist pattern revealed that there was no footing profile and so on, and that the pattern had a square profile, namely a vertical wall profile.

Next, the antireflection film was etched under dry etching conditions in which the silicone film has sufficiently higher etching rate than organic compositions with using the resist pattern as an etching mask. A dry-etching-system TE-8500P manufactured by Tokyo Electron, Ltd. was used, and the etching conditions were as follows. Chamber Pressure: 40 Pa, RF Power: 1,300 W, Gap: 9 mm, $CHF_3$ Gas Flow Rate: 30 ml/min, $CF_4$ Gas Flow Rate: 30 ml/min, Ar Gas Flow Rate: 100 ml/min In this way, the antireflection film was etched by the dry etching to form a pattern on the antireflection film while pattern deformation due to side etching of the photoresist film hardly influenced the pattern.

After that, the substrate having the pattern-transferred antireflection film was etched under dry etching conditions in which the underlying organic film has sufficiently higher etching rate than the antireflection film. The etching was conducted by reactive dry etching with oxygen plasma, and the etching conditions were as follows.

Chamber Pressure: 60 Pa, RF Power: 600 W, Ar Gas Flow Rate: 40 sccm, $O_2$ Gas Flow Rate: 60 sccm, Gap: 9 mm By the reactive dry etching, the exposed pattern obtained as the resist pattern was transferred to the underlying organic film precisely.

Subsequently, the substrate was etched with using the pattern-transferred organic film as an etching mask to form a pattern on the substrate. At this time, because the process layer of the substrate was made of silicon oxide, dry etching conditions using fluoride gas was used. With the dry etching conditions, the process layer of the substrate was patterned and the antireflection film on the organic film was also etched and removed.

After that, the organic film remaining on the substrate was removed by oxygen gas plasma etching.

The pattern formed on the substrate was observed and it was confirmed that an excellent pattern was formed.

Example 4

First, a composition (28 parts by mass of a resin, and 100 parts by mass of a solvent) of 4,4'-(9H-fluorene-9-ylidene) bisphenol novolac resin (molecular weight: 11000) was spin-coated on a substrate, and was heated at 200 degrees C. for 1 minute to form an organic film with a thickness of 300 nm.

Second, an antireflection film composition was spin-coated on the organic film, and heated for 60 seconds at 200 degrees C. to form an antireflection film with a thickness of 100 nm.

The antireflection film composition used at this time contained 100 parts by mass of Polymer 1 obtained in Synthetic Example 1, 2000 parts by mass of an organic solvent (PGMEA), 1 part by mass of a first acid generator: benzyl triethylammonium bromide, which is decomposed at a temperature of 194 degrees C., and 1 part by mass of a surfactant (FC4430 manufactured by Sumitomo 3M).

Then a substrate with an organic film, an antireflection film on the organic film, and a photoresist film on the antireflection film was prepared as with Example 1.

The intermixing phenomenon was not observed in the vicinity of the antireflection film/photoresist film interface.

Subsequently, pattern circuit areas of the photoresist film was exposed with the ArF exposure system (S305B, NA0.68, σ0.85, ⅔ annular illumination, a Cr mask, manufactured by Nikon Corporation), baked for 90 seconds at 110 degrees C., and developed in 2.38 mass % aqueous solution of tetra methyl ammonium hydroxide (TMAH), to obtain a 90 nm line/space pattern.

Observation of thus-obtained positive resist pattern revealed that there was no footing profile and so on, and that the pattern had a square profile, namely a vertical wall profile.

Next, the antireflection film was etched under dry etching conditions in which the antireflection film has sufficiently higher etching rate than organic compositions with using the resist pattern as an etching mask. A dry-etching-system TE-8500P manufactured by Tokyo Electron, Ltd. was used, and the etching conditions were as follows.

Chamber Pressure: 40 Pa, RF Power: 1,300 W, Gap: 9 mm, $CHF_3$ Gas Flow Rate: 30 ml/min, $CF_4$ Gas Flow Rate: 30 ml/min, Ar Gas Flow Rate: 100 ml/min In this way, the antireflection film was etched by the dry etching to form a pattern on the antireflection film while pattern deformation due to side etching of the photoresist film hardly influenced the pattern.

After that, the substrate having the pattern-transferred antireflection film was etched under dry etching conditions in which the underlying organic film has sufficiently higher etching rate than the antireflection film. The etching was conducted by reactive dry etching with oxygen plasma, and the etching conditions were as follows.

Chamber Pressure: 60 Pa, RF Power: 600 W, Ar Gas Flow Rate: 40 sccm, $O_2$ Gas Flow Rate: 60 sccm, Gap: 9 mm By the reactive dry etching, the exposed pattern obtained as the resist pattern was transferred to the underlying organic film precisely.

Subsequently, the substrate was etched with using the pattern-transferred organic film as an etching mask to form a pattern on the substrate. At this time, because the process layer of the substrate was made of silicon oxide, dry etching conditions using fluoride gas was used. With the dry etching conditions, the process layer of the substrate was patterned and the antireflection film on the organic film was also etched and removed.

After that, the organic film remaining on the substrate was removed by oxygen gas plasma etching.

The pattern formed on the substrate was observed and it was confirmed that an excellent pattern was formed.

Examples 5 to 32

As with Example 1, first, a composition (28 parts by mass of a resin, and 100 parts by mass of a solvent) of 4,4'-(9H-fluorene-9-ylidene)bisphenol novolac resin (molecular weight: 11000) was spin-coated on a substrate, and was heated at 200 degrees C. for 1 minute to form an organic film with a thickness of 300 nm.

Second, as with Example 1, silicon-containing antireflection film compositions shown in the following Table 1 were coated on the organic film to form an antireflection films, respectively (Examples 5 to 32).

TABLE 1

|  | Silicone Resin (parts by mass) | First Acid Generator (parts by mass) | Second Acid Generator (parts by mass) | Organic Solvent (parts by mass) | Surfactant (parts by mass) | Baking Temperature (degree C.) | Film Thickness (nm) |
|---|---|---|---|---|---|---|---|
| Example 5 | Polymer1 (100) | AG2 (1) | — | PGMEA (2000) | FC4430 (1) | 200 | 100 |

TABLE 1-continued

| | Silicone Resin (parts by mass) | First Acid Generator (parts by mass) | Second Acid Generator (parts by mass) | Organic Solvent (parts by mass) | Surfactant (parts by mass) | Baking Temperature (degree C.) | Film Thickness (nm) |
|---|---|---|---|---|---|---|---|
| Example 6 | Polymer1 (100) | AG3 (1) | — | PGMEA (2000) | FC4430 (1) | 200 | 100 |
| Example 7 | Polymer1 (100) | AG4 (1) | — | PGMEA (2000) | FC4430 (1) | 200 | 100 |
| Example 8 | Polymer1 (100) | AG5 (1) | — | PGMEA (2000) | FC4430 (1) | 200 | 100 |
| Example 9 | Polymer1 (100) | AG6 (1) | — | PGMEA (2000) | FC4430 (1) | 200 | 100 |
| Example 10 | Polymer1 (100) | AG7 (1) | — | PGMEA (2000) | FC4430 (1) | 200 | 100 |
| Example 11 | Polymer1 (100) | AG8 (1) | — | PGMEA (2000) | FC4430 (1) | 200 | 100 |
| Example 12 | Polymer1 (100) | AG1 (1) | AG9 (1) | PGMEA (2000) | FC4430 (1) | 200 | 100 |
| Example 13 | Polymer1 (100) | AG2 (1) | AG9 (1) | PGMEA (2000) | FC4430 (1) | 200 | 100 |
| Example 14 | Polymer1 (100) | AG3 (1) | AG9 (1) | PGMEA (2000) | FC4430 (1) | 200 | 100 |
| Example 15 | Polymer1 (100) | AG4 (1) | AG9 (1) | PGMEA (2000) | FC4430 (1) | 200 | 100 |
| Example 16 | Polymer1 (100) | AG5 (1) | AG9 (1) | PGMEA (2000) | FC4430 (1) | 200 | 100 |
| Example 17 | Polymer1 (100) | AG6 (1) | AG9 (1) | PGMEA (2000) | FC4430 (1) | 200 | 100 |
| Example 18 | Polymer1 (100) | AG7 (1) | AG9 (1) | PGMEA (2000) | FC4430 (1) | 200 | 100 |
| Example 19 | Polymer1 (50) | AG1 (1) | AG9 (1) | PGMEA (2000) | FC4430 (0.5) | 200 | 40 |
| Example 20 | Polymer1 (50) | AG2 (1) | AG9 (1) | PGMEA (2000) | FC4430 (0.5) | 200 | 40 |
| Example 21 | Polymer1 (50) | AG3 (1) | AG9 (1) | PGMEA (2000) | FC4430 (0.5) | 200 | 40 |
| Example 22 | Polymer1 (50) | AG4 (1) | AG9 (1) | PGMEA (2000) | FC4430 (0.5) | 200 | 40 |
| Example 23 | Polymer1 (50) | AG5 (1) | AG9 (1) | PGMEA (2000) | FC4430 (0.5) | 200 | 40 |
| Example 24 | Polymer1 (50) | AG6 (1) | AG9 (1) | PGMEA (2000) | FC4430 (0.5) | 200 | 40 |
| Example 25 | Polymer1 (50) | AG7 (1) | AG9 (1) | PGMEA (2000) | FC4430 (0.5) | 200 | 40 |
| Example 26 | Polymer2 (100) | AG1 (1) | AG9 (1) | PGMEA (2000) | FC4430 (1) | 200 | 100 |
| Example 27 | Polymer2 (100) | AG2 (1) | AG9 (1) | PGMEA (2000) | FC4430 (1) | 200 | 100 |
| Example 28 | Polymer5 (100) | AG3 (1) | AG9 (1) | PGMEA (2000) | FC4430 (1) | 200 | 100 |
| Example 29 | Polymer5 (100) | AG4 (1) | AG9 (1) | PGMEA (2000) | FC4430 (1) | 200 | 100 |
| Example 30 | Polymer5 (100) | AG5 (1) | AG9 (1) | PGMEA (2000) | FC4430 (1) | 200 | 100 |
| Example 31 | Polymer5 (100) | AG6 (1) | AG9 (1) | PGMEA (2000) | FC4430 (1) | 200 | 100 |
| Example 32 | Polymer5 (100) | AG7 (1) | AG9 (1) | PGMEA (2000) | FC4430 (1) | 200 | 100 |

In Table 1, the first acid generators are as follows.
AG1: benzyltributylammonium chloride (decomposition temperature: 164 degrees C.)
AG2: TAG2683 manufactured by king industry (decomposition temperature: 100 to 110 degrees C.)
AG3: CXC1612 manufactured by king industry (decomposition temperature: 100 to 110 degrees C.)
AG4: TAG2278 manufactured by king industry (decomposition temperature: 120 to 130 degrees C.)
AG5: TAG2678 manufactured by king industry (decomposition temperature: 125 to 135 degrees C.)
AG6: TAG2681 manufactured by king industry (decomposition temperature: 160 to 170 degrees C.)
AG7: TAG2679 manufactured by king industry (decomposition temperature: 160 to 170 degrees C.)
AG8: C1621 manufactured by king industry (decomposition temperature: 160 to 170 degrees C.)
The second acid generator is as follows.
AG9: TPS-109 manufactured by Midori Kagaku Co., Ltd. (photoacid generator, decomposition temperature: higher than 200 degrees C.)

Then a substrate with an organic film, an antireflection film on the organic film, and a photoresist film on the antireflection film was prepared as with Example 1.

The intermixing phenomenon was not observed in the vicinity of the antireflection film/photoresist film interface in every film.

Subsequently, pattern circuit areas of the photoresist film was exposed with the ArF exposure system (S305B, NA0.68, σ0.85, ⅔ annular illumination, a Cr mask, manufactured by Nikon Corporation), baked for 90 seconds at 110 degrees C., and developed in 2.38 mass % aqueous solution of tetra methyl ammonium hydroxide (TMAH), to obtain a 90 nm line/space pattern.

Observation of thus-obtained positive resist pattern revealed that there was no footing profile and so on, and that the pattern had a square profile, namely a vertical wall profile in every substrate.

Next, the antireflection film was etched under dry etching conditions in which the antireflection film has sufficiently higher etching rate than organic compositions with using the resist pattern as an etching mask. A dry-etching-system TE-8500P manufactured by Tokyo Electron, Ltd. was used, and the etching conditions were as follows.

Chamber Pressure: 40 Pa, RF Power: 1,300 W, Gap: 9 mm, $CHF_3$ Gas Flow Rate: 30 ml/min, $CF_4$ Gas Flow Rate: 30 ml/min, Ar Gas Flow Rate: 100 ml/min In this way, the antireflection film was etched by the dry etching to form a pattern on the antireflection film while pattern deformation due to side etching of the photoresist film hardly influenced the pattern.

After that, the substrate having the pattern-transferred antireflection film was etched under dry etching conditions in which the underlying organic film has sufficiently higher etching rate than the antireflection film. The etching was conducted by reactive dry etching with oxygen plasma, and the etching conditions were as follows.

Chamber Pressure: 60 Pa, RF Power: 600 W, Ar Gas Flow Rate: 40 sccm, $O_2$ Gas Flow Rate: 60 sccm, Gap: 9 mm By the reactive dry etching, the exposed pattern obtained as the resist pattern was transferred to the underlying organic film precisely.

Subsequently, the substrate was etched with using the pattern-transferred organic film as an etching mask to form a pattern on the substrate. At this time, because the process layer of the substrate was made of silicon oxide, dry etching conditions using fluoride gas was used. With the dry etching conditions, the process layer of the substrate was patterned and the antireflection film on the organic film was also etched and removed.

After that, the organic film remaining on the substrate was removed by oxygen gas plasma etching. The pattern formed on the substrate was observed and it was confirmed that an excellent pattern was formed.

Comparative Example 1

As with Example 1, first, an organic film was formed on a substrate.

Second, an antireflection film composition was spin-coated on the organic film, and heated for 60 seconds at 250 degrees C. to form an intermediate layer with a thickness of 100 nm.

The antireflection film composition used at this time contained 100 parts by mass of Polymer 1 obtained in Synthetic Example 1, 2000 parts by mass of an organic solvent (PGMEA), 1 part by mass of an acid generator: benzyl trimethylammonium bromide, which is decomposed at a temperature of 239 degrees C., and 1 part by mass of a surfactant (FC4430 manufactured by Sumitomo 3M).

As with Example 1, a photoresist film was formed on the antireflection film.

In this way, a substrate with an organic film, an antireflection film on the organic film, and a photoresist film on the antireflection film was prepared.

The organic film was damaged heavily, because the antireflection film was baked at high temperature.

It was attempted to form a 90 nm line/space pattern by exposing pattern circuit areas of the photoresist film with the ArF exposure system (S305B, NA0.68, σ0.85, ⅔ annular illumination, a Cr mask, manufactured by Nikon Corporation), baking for 90 seconds at 110 degrees C., and developing in 2.38 mass % aqueous solution of tetra methyl ammonium hydroxide (TMAH).

Observation of thus-obtained positive resist pattern revealed that the pattern had severe negative profile and did not have enough quality to carry out subsequent patterning.

Comparative Example 2

As with Example 1, first, an organic film was formed on a substrate.

Second, an antireflection film composition was spin-coated on the organic film, and heated for 60 seconds at 200 degrees C. to form an intermediate layer with a thickness of 100 nm.

The antireflection film composition used at this time contained 100 parts by mass of Polymer 3 obtained in Synthetic Example 3, 2000 parts by mass of an organic solvent (PGMEA), 1 part by mass of an acid generator: benzyl tributylammonium chloride, which is decomposed at a temperature of 164 degrees C., and 1 part by mass of a surfactant (FC4430 manufactured by Sumitomo 3M).

As with Example 1, a photoresist film was formed on the antireflection film.

In this way, a substrate with an organic film, an antireflection film on the organic film, and a photoresist film on the antireflection film was prepared.

It was attempted to form a 90 nm line/space pattern by exposing pattern circuit areas of the photoresist film with the ArF exposure system (S305B, NA0.68, σ0.85, ⅔ annular illumination, a Cr mask, manufactured by Nikon Corporation), baking for 90 seconds at 110 degrees C., and developing in 2.38 mass % aqueous solution of tetra methyl ammonium hydroxide (TMAH).

Observation of thus-obtained positive resist pattern revealed that the pattern had severe negative profile and did not have enough quality to carry out subsequent patterning.

Comparative Example 3

As with Example 1, first, an organic film was formed on a substrate.

Second, an antireflection film composition was spin-coated on the organic film, and baked for 60 seconds at 200 degrees C. to form an intermediate layer with a thickness of 100 nm.

The antireflection film composition used at this time contained 100 parts by mass of Polymer 4 obtained in Synthetic Example 4, 2000 parts by mass of an organic solvent (PGMEA), 1 part by mass of a thermal acid generator: benzyl tributylammonium chloride, which is decomposed at a temperature of 164 degrees C., and 1 part by mass of a surfactant (FC4430 manufactured by Sumitomo 3M).

As with Example 1, a photoresist film was formed on the antireflection film.

In this way, a substrate with an organic film, an antireflection film on the organic film, and a photoresist film on the antireflection film was prepared.

It was attempted to form a 90 nm line/space pattern by exposing pattern circuit areas of the photoresist film with the ArF exposure system (S305B, NA0.68, σ0.85, ⅔ annular illumination, a Cr mask, manufactured by Nikon Corporation), baking for 90 seconds at 110 degrees C., and developing in 2.38 mass % aqueous solution of tetra methyl ammonium hydroxide (TMAH).

Observation of thus-obtained positive resist pattern revealed that the pattern had severe negative profile and did not have enough quality to carry out subsequent patterning.

Examples 33 to 37

As with Example 1, first, organic films were formed on substrates.

Second, as with Example 1, silicon-containing antireflection film compositions shown in the following Table 2 were coated on the organic film to form antireflection films, respectively (Examples 33 to 37).

TABLE 2

| | Silicone Resin (parts by mass) | First Acid Generator (parts by mass) | Second Acid Generator (parts by mass) | Organic Solvent (parts by mass) | Surfactant (parts by mass) | Baking Temperature (degree C.) | Film Thickness (nm) |
|---|---|---|---|---|---|---|---|
| Example 33 | Polymer1 (50) | AG1 (1) | — | PGMEA (2000) | FC4430 (1) | 200 | 40 |
| Example 34 | Polymer1 (50) | AG2 (1) | — | PGMEA (2000) | FC4430 (1) | 200 | 40 |
| Example 35 | Polymer1 (50) | AG3 (1) | — | PGMEA (2000) | FC4430 (1) | 200 | 40 |
| Example 36 | Polymer1 (50) | AG4 (1) | — | PGMEA (2000) | FC4430 (1) | 200 | 40 |
| Example 37 | Polymer1 (50) | AG5 (1) | — | PGMEA (2000) | FC4430 (1) | 200 | 40 |

As with Example 1, a photoresist film was formed on the antireflection film.

In this way, a substrate with an organic film, an antireflection film on the organic film, and a photoresist film on the antireflection film was prepared.

Subsequently, pattern circuit areas of the photoresist film was exposed with the ArF exposure system (S305B, NA0.68, σ0.85, ⅔ annular illumination, a Cr mask, manufactured by Nikon Corporation), baked for 90 seconds at 110 degrees C., and developed in 2.38 mass % aqueous solution of tetra methyl ammonium hydroxide (TMAH), to obtain a 90 nm line/space pattern. The results are shown in Table 3.

TABLE 3

| | Resist Pattern Profile |
|---|---|
| Example 33 | almost vertical profile and some footing profile |
| Example 34 | almost vertical profile and some footing profile |
| Example 35 | almost vertical profile and some footing profile |
| Example 36 | almost vertical profile and some footing profile |
| Example 37 | almost vertical profile and some footing profile |

Observation of thus-obtained positive resist pattern revealed that the pattern had almost vertical profile as a whole and some footing profile.

In view of these results and the results of Examples of 19 to 25, it has confirmed that 40 nm thick thin films have resist patterns with almost vertical profile more certainly by adding a first acid generator and a second acid generator that has higher decomposition temperature than the first acid generator.

The present invention is not limited to the above-described embodiments. The above-described embodiments are mere examples, and those having the substantially same structure as that described in the appended claims and providing the similar action and advantages are included in the scope of the present invention.

The invention claimed is:

1. An antireflection film composition used for lithography comprising: at least
a light absorbing silicone resin with mass average molecular weight of 30,000 or less in which components having molecular weight of less than 600 account for 5% or less of the whole resin;
a first acid generator that is decomposed at a temperature of 200 degrees C. or less;
a second acid generator that has a higher decomposition temperature than the first acid generator; and
an organic solvent.

2. The antireflection film composition according to claim 1, wherein a decomposition temperature of the second acid generator is higher than a baking temperature of the antireflection film composition.

3. The antireflection film composition according to claim 2, wherein the decomposition temperature of the second acid generator is higher than 200 degrees C.

4. The antireflection film composition according to claim 3, wherein the second acid generator generates acid upon exposure to radiation.

5. The antireflection film composition according to claim 4, wherein the light absorbing silicone resin comprises:
an organic group having one or more of a carbon-oxygen single bond and/or one or more of a carbon-oxygen double bond;
a light absorbing group; and
a silicon atom whose end is one or more of Si—OH and/or one or more of Si—OR (R represents an alkyl group).

6. The antireflection film composition according to claim 5, wherein the organic group of the light absorbing silicone resin comprises one or more group selected from the group consisting of an epoxy group, an ester group, an alkoxy group, and a hydroxy group.

7. The antireflection film composition according to claim 6, wherein the light absorbing group of the light absorbing silicone resin comprises one or more ring selected from the group consisting of an anthracene ring, a naphthalene ring, and a benzene ring.

8. The antireflection film composition according to claim 7, wherein the light absorbing group of the light absorbing silicone resin comprises a silicon-silicon bond.

9. The antireflection film composition according to claim 8, further comprising a neutralizer.

10. The antireflection film composition according to claim 2, wherein the second acid generator generates acid upon exposure to radiation.

11. The antireflection film composition according to claim 1, wherein a decomposition temperature of the second acid generator is higher than 200 degrees C.

12. The antireflection film composition according to claim 11, wherein the second acid generator generates acid upon exposure to radiation.

13. The antireflection film composition according to claim 1, wherein the second acid generator generates acid upon exposure to radiation.

14. The antireflection film composition according to claim 1, wherein the light absorbing silicone resin comprises:
   an organic group having one or more of a carbon-oxygen single bond and/or one or more of a carbon-oxygen double bond;
   a light absorbing group; and
   a silicon atom whose end is one or more of Si—OH and/or one or more of Si—OR (R represents an alkyl group).

15. The antireflection film composition according to claim 14, wherein the organic group of the light absorbing silicone resin comprises one or more group selected from the group consisting of an epoxy group, an ester group, an alkoxy group, and a hydroxy group.

16. The antireflection film composition according to claim 14, wherein the light absorbing group of the light absorbing silicone resin comprises one or more ring selected from the group consisting of an anthracene ring, a naphthalene ring, and a benzene ring.

17. The antireflection film composition according to claim 14, wherein the light absorbing group of the light absorbing silicone resin comprises a silicon-silicon bond.

18. The antireflection film composition according to claim 1, further comprising a neutralizer.

19. A substrate comprising at least an antireflection film formed with the antireflection film composition according to claim 1, and a positive photoresist film over the antireflection film.

20. A patterning process for a substrate by lithography comprising:
   applying to a substrate the antireflection film composition according to claim 1;
   baking the antireflection film composition to form an antireflection film;
   applying a photoresist film composition to the antireflection film;
   pre-baking the photoresist film composition to form a photoresist film;
   exposing a pattern circuit area of the photoresist film;
   subsequently developing the photoresist film with a developer to form a resist pattern on the photoresist film; and
   etching the antireflection film and the substrate using as a mask the photoresist film on which the resist pattern is formed to pattern the substrate.

21. A patterning process for a substrate by lithography comprising:
   applying to a substrate the antireflection film composition according to claim 1;
   baking the antireflection film composition to form an antireflection film;
   applying a photoresist film composition to the antireflection film;
   pre-baking the photoresist film composition to form a photoresist film;
   exposing a pattern circuit area of the photoresist film;
   subsequently developing the photoresist film with a developer to form a resist pattern on the photoresist film;
   etching the antireflection film using as a mask the photoresist film on which the resist pattern is formed; and
   etching the substrate using the patterned antireflection film as a mask to pattern the substrate.

22. A patterning process for a substrate by lithography comprising:
   forming an organic film over a substrate;
   applying to the organic film the antireflection film composition according to claim 1;
   baking the antireflection film composition to form an antireflection film;
   applying a photoresist film composition to the antireflection film;
   pre-baking the photoresist film composition to form a photoresist film;
   exposing a pattern circuit area of the photoresist film;
   subsequently developing the photoresist film with a developer to form a resist pattern on the photoresist film;
   etching the antireflection film using as a mask the photoresist film on which the resist pattern is formed;
   etching the organic film using the patterned antireflection film as a mask; and
   etching the substrate to pattern the substrate.

* * * * *